(12) United States Patent
Menard

(10) Patent No.: US 8,261,660 B2
(45) Date of Patent: Sep. 11, 2012

(54) VACUUM COUPLED TOOL APPARATUS FOR DRY TRANSFER PRINTING SEMICONDUCTOR ELEMENTS

(75) Inventor: Etienne Menard, Durham, NC (US)

(73) Assignee: Semprius, Inc., Durham, NC (US)

( * ) Notice: Subject to any disclaimer, the term of this patent is extended or adjusted under 35 U.S.C. 154(b) by 492 days.

(21) Appl. No.: 12/507,262

(22) Filed: Jul. 22, 2009

(65) Prior Publication Data

US 2011/0018158 A1    Jan. 27, 2011

(51) Int. Cl.
B41F 17/00    (2006.01)
(52) U.S. Cl. ............ 101/32; 101/35; 101/41; 101/109
(58) Field of Classification Search ............... 101/32
See application file for complete search history.

(56) References Cited

U.S. PATENT DOCUMENTS

| | | | |
|---|---|---|---|
| 3,453,714 A | 7/1969 | Clark et al. | |
| 4,233,261 A * | 11/1980 | Mijnheer | 264/293 |
| 4,503,335 A | 3/1985 | Takahashi | |
| 5,151,386 A | 9/1992 | Bottani et al. | |
| 5,512,131 A | 4/1996 | Kumar et al. | |
| 5,669,303 A | 9/1997 | Maracas et al. | |
| 5,789,117 A | 8/1998 | Chen | |
| 5,817,242 A | 10/1998 | Biebuyck et al. | |
| 5,937,758 A | 8/1999 | Maracas et al. | |
| 5,947,027 A | 9/1999 | Burgin et al. | |
| 6,062,133 A | 5/2000 | Blalock | |
| 6,333,561 B1 | 12/2001 | Chen | |
| 6,521,489 B2 | 2/2003 | Duthaler et al. | |
| 6,675,465 B2 | 1/2004 | Ulrich | |
| 6,740,543 B2 | 5/2004 | Rutiser | |
| 6,792,856 B2 | 9/2004 | Hall et al. | |
| 6,805,054 B1 * | 10/2004 | Meissl et al. | 101/130 |
| 6,829,988 B2 | 12/2004 | George et al. | |
| 6,855,378 B1 | 2/2005 | Narang | |
| 6,876,081 B2 | 4/2005 | Chow | |
| 6,881,366 B2 | 4/2005 | Hougham et al. | |

(Continued)

FOREIGN PATENT DOCUMENTS

TW    200710562    3/2007

(Continued)

OTHER PUBLICATIONS

Article 19 Claim Amendments to International Application No. PCT/US2010/039414, filed with International Bureau of WIPO Oct. 29, 2010.

(Continued)

*Primary Examiner* — Jill Culler
(74) *Attorney, Agent, or Firm* — Greenlee Sullivan P.C.

(57) ABSTRACT

Provided are an optimized tool apparatus and methods for dry transfer printing of semiconductor elements with high yield and good placement accuracy. The tool apparatus comprises a vacuum coupled fast peel apparatus that provides high pickup yield of the semiconductor elements. In an aspect, this vacuum coupled apparatus provides high pickup rates during pickup of the semiconductor elements from a donor/source wafer. Provided is a tool apparatus for dry transfer printing with a reinforced composite stamp having a thin glass-backing. The tool apparatus also comprises a pressure regulated micro-chamber which provides precise control of a composite stamp lamination and de-lamination. In an aspect, the micro-chamber has an internal cavity volume that is variably controlled, thereby providing precise control of the force on the stamp, and corresponding separation velocity, and improved semiconductor element pick-up and/or placement.

33 Claims, 9 Drawing Sheets

U.S. PATENT DOCUMENTS

| | | | |
|---|---|---|---|
| 6,918,982 B2 | 7/2005 | Afzali-Ardakani et al. | |
| 6,976,424 B2 | 12/2005 | Bruno et al. | |
| 6,994,541 B2* | 2/2006 | Chung et al. | 425/385 |
| 7,117,790 B2 | 10/2006 | Kendale et al. | |
| 7,144,539 B2* | 12/2006 | Olsson | 264/293 |
| 7,195,733 B2 | 3/2007 | Rogers et al. | |
| 7,195,734 B2* | 3/2007 | Heidari | 264/667 |
| 7,207,430 B2 | 4/2007 | Davis et al. | |
| 7,235,464 B2 | 6/2007 | Bona et al. | |
| 7,295,256 B2 | 11/2007 | Kim | |
| 7,296,519 B2 | 11/2007 | Dona et al. | |
| 7,363,854 B2 | 4/2008 | Sewell | |
| 7,429,552 B2 | 9/2008 | Afzali-Ardakani et al. | |
| 7,434,512 B2 | 10/2008 | Bietsch et al. | |
| 7,476,523 B2* | 1/2009 | Schueller et al. | 101/327 |
| 7,521,292 B2 | 4/2009 | Rogers et al. | |
| 7,557,367 B2 | 7/2009 | Rogers et al. | |
| 7,622,367 B1 | 11/2009 | Nuzzo et al. | |
| 7,641,468 B2* | 1/2010 | Wu et al. | 425/405.1 |
| 7,665,983 B2* | 2/2010 | Kendale et al. | 425/546 |
| 7,704,684 B2 | 4/2010 | Rogers et al. | |
| 2002/0140298 A1 | 10/2002 | Maruyama | |
| 2003/0047535 A1 | 3/2003 | Schueller et al. | |
| 2003/0213382 A1 | 11/2003 | Kendale et al. | |
| 2005/0062066 A1 | 3/2005 | Bao et al. | |
| 2005/0103270 A1 | 5/2005 | Yoshida et al. | |
| 2005/0173049 A1 | 8/2005 | Dona et al. | |
| 2006/0196377 A1 | 9/2006 | Loopstra et al. | |
| 2006/0234499 A1 | 10/2006 | Kodera et al. | |
| 2006/0286488 A1 | 12/2006 | Rogers et al. | |
| 2006/0286785 A1 | 12/2006 | Rogers et al. | |
| 2007/0032089 A1 | 2/2007 | Nuzzo et al. | |
| 2007/0280578 A1 | 12/2007 | Glebov et al. | |
| 2008/0000373 A1 | 1/2008 | Petrucci-Samija et al. | |
| 2008/0055581 A1 | 3/2008 | Rogers et al. | |
| 2008/0108171 A1 | 5/2008 | Rogers et al. | |
| 2008/0157235 A1 | 7/2008 | Rogers et al. | |
| 2009/0199960 A1 | 8/2009 | Nuzzo et al. | |
| 2010/0002402 A1 | 1/2010 | Rogers et al. | |
| 2010/0018420 A1 | 1/2010 | Menard | |
| 2010/0052112 A1 | 3/2010 | Rogers et al. | |
| 2010/0123268 A1 | 5/2010 | Menard | |

FOREIGN PATENT DOCUMENTS

| | | |
|---|---|---|
| TW | 200738553 | 10/2007 |
| TW | 2008/48812 | 12/2008 |
| TW | 200904640 | 2/2009 |
| WO | WO 97/06012 | 2/1997 |
| WO | WO 2005/104756 | 11/2005 |
| WO | WO 2005/122285 | 12/2005 |
| WO | WO 2006/130721 | 12/2006 |
| WO | WO 2007/126412 | 11/2007 |
| WO | WO 2008/030960 | 3/2008 |
| WO | WO 2008/036837 | 3/2008 |
| WO | WO2008/047144 | 4/2008 |
| WO | WO 2008/047144 | 4/2008 |
| WO | WO 2008/055054 | 5/2008 |
| WO | WO2008/055054 | 5/2008 |
| WO | WO 2008/143635 | 11/2008 |
| WO | WO 2009/011709 | 1/2009 |
| WO | WO 2009/111641 | 9/2009 |
| WO | WO 2010/011713 | 1/2010 |
| WO | WO 2010/036807 | 4/2010 |

OTHER PUBLICATIONS

Informal comments related to Article 19 Claim Amendments to International Application No. PCT/US2010/039414, filed with International Bureau of WIPO Oct. 29, 2010.

Benkendorfer et al. (Jun. 2007) "Printing Unities III-Vs and Silicon," *Compounds Semiconductor* 3 pages.

International Search Report and Written Opinion, Corresponding to International Application No. PCT/US09/51350, Mailed Sep. 24, 2009.

International Search Report and Written Opinion, Corresponding to International Application No. PCT/US2009/065078, Mailed Apr. 23, 2010.

Michel et al. (Sep. 2001) "Printing Meets Lithography: Soft Approaches to High-Resolution Patterning," *IBM J. Res. Dev.* 45(5):697-708.

Parker, J.L. (Aug. 1, 2006) "An Analytical Characterization of PCB Delamination and Comparison of Adhesion Tests," *Printed Circuit Design FAB* http://www.pcdandf.com/cms/magazine/172/2802-an-analytical-characterization-of-pcb-delamination-and-comparison-of-adhesion-tests.

Sun et al. (2004) "Fabricating Semiconductor Nano/Microwires and Transfer Printing Ordered Arrays of Them onto Plastic Substrates," *Nano Lett.* 4(10):1953-1959.

International Search Report and Written Opinion, Corresponding to International Application No. PCT/US2010/039414, Mailed Sep. 1, 2010.

\* cited by examiner

A

B

VACUUM COUPLED TOOL APPARATUS FOR DRY TRANSFER PRINTING SEMICONDUCTOR ELEMENTS

STATEMENT REGARDING FEDERALLY SPONSORED RESEARCH OR DEVELOPMENT

This invention was made, at least in part, with United States governmental support awarded by National Science Foundation Grant IIP-0712017. The United States Government has certain rights in this invention.

BACKGROUND OF THE INVENTION

Provided herein are devices and processes for transfer printing of semiconductors. More specifically the devices relate to a tool apparatus for transfer printing semiconductor elements with high transfer printing yield and placement accuracy.

Semiconductor chip or die automated assembly equipments typically rely on the use of vacuum operated placement heads often referred to as vacuum grippers or pick-and-place tools. In their simplest embodiment, these placement heads typically consist of an open ended cylinder having a drilled nozzle surface which seals to the die to accomplish physical attachment. Semiconductor chips or die which are ultra thin, fragile, or too small cannot be economically handled by traditional vacuum grippers. As a result, alternative approaches such as self-assembly or dry transfer printing technologies are being investigated.

Transfer printing enables the massively parallel assembly of semiconductor devices, including for example, high performance semiconductor devices, onto virtually any substrate material, including glass, plastics, metals or other semiconductors (see, e.g., U.S. patent application Ser. No. 11/145,574 METHODS AND DEVICES FOR FABRICATING AND ASSEMBLING PRINTABLE SEMICONDUCTOR ELEMENTS filed Jun. 2, 2005). This semiconductor transfer printing technology relies on the use of a microstructured elastomeric stamp to selectively pick-up devices from a source wafer and then prints these devices onto a receiving substrate. The transfer process is massively parallel as the stamps are designed to transfer hundreds to thousands of discrete structures in a single pick-up and print operation.

While pick-and-place tools rely on suction forces, dry transfer printing tools rely on surface adhesion forces to control the pickup and release of the semiconductor devices. To enable dry transfer printing, methods to control the adhesion of semiconductor elements to an elastomeric stamp are required. One such method is described in U.S. patent application Ser. No. 11/423,192 filed Jun. 9, 2006 titled "PATTERN TRANSFER PRINTING BY KINETIC CONTROL OF ADHESION TO AN ELASTOMERIC STAMP." In that method, the adhesion of the semiconductor elements to the stamp is controlled by adjusting the delamination rate of the elastomeric transfer stamp. This control of separation or delamination rate provides a means of increasing the pickup yield of semiconductor elements from a source wafer. This technique has been successfully used for bulk (single component) or thick (i.e. >1 mm) elastomeric stamps. There are, however, challenges with that technique for use with high fidelity, thin, (e.g., <1 mm) composite stamps. Composite stamps optimized for dry transfer printing semiconductor elements with high placement accuracy typically use high stiffness reinforcement materials as described in U.S. patent application Ser. No. 12/177,963, filed Jul. 23, 2008 titled "REINFORCED COMPOSITE STAMP FOR DRY TRANS-FER PRINTING OF SEMICONDUCTOR ELEMENTS." Those composite stamps can be used with a shear-assisted method to control the release yield of the semiconductor elements to a receiving substrate as described in U.S. Pat. App. No. 61/116,136 filed Nov. 19, 2008 titled "PRINTING SEMICONDUCTOR ELEMENTS BY SHEAR-ASSISTED ELASTOMERIC STAMP TRANSFER." However, to date, no apparatus are currently capable of handling this new class of reinforced composite stamps while providing kinetic and shear-assisted control of adhesion.

Accordingly, there is a need for a novel tool apparatus to enable precise control of this novel class of reinforced composite stamps and achieve transfer printing semiconductor elements with high transfer printing yield and placement accuracy.

SUMMARY OF THE INVENTION

This application is related to U.S. patent application Ser. No. 12/177,963 (120-08), filed Jul. 23, 2008, and U.S. Patent Application No. 61/116,136 (166-08P) filed Nov. 19, 2008 which are specifically incorporated by reference to the extent not inconsistent herewith.

Provided herein are devices and methods for transferring semiconductor elements from a donor substrate to a transfer surface. The devices and methods provide improvements in printing yield, placement accuracy and fidelity compared to traditional processes. In particular, a fundamental parameter related to the transfer printing improvement relates to establishing and controlling a pressure difference across the stamp (calculated as the pressure difference at the stamp transfer surface and the corresponding stamp top surface) during the transfer process. In contrast to conventional or traditional processes that generate pressures by mechanically pressing thick or semi-stiff stamps against a substrate or by manipulating the amount of gas fluid in a pressure chamber operationally connected to the transfer stamp, provided herein are devices capable of controlling the pressure in a micro-chamber defined by the stamp top surface by manipulating the volume of a micro-chamber under air-tight conditions. For example, the micro-chamber may be pressurized to facilitate conformal contact or lamination between a transfer stamp surface and a substrate supporting or comprising a semiconductor element. Sealing the micro-chamber to form an air-tight seal and subsequently expanding the micro-chamber volume to achieve rapid depressurization provides improved transferability characteristics and process speeds not achieved by traditional devices and methods that remove a gas to decrease pressure in a chamber whose volume does not vary.

Provided herein are optimized tool apparatus for dry transfer printing semiconductor elements. More specifically, the devices and methods provide improved semiconductor or other feature transfer by incorporating: 1) A pressure regulated micro-chamber to provide precise control of a stamp lamination/de-lamination. 2) A vacuum coupled fast peel apparatus designed to achieve high pickup rates by stamps during pickup of the semiconductor elements from a donor/source wafer. This vacuum coupled apparatus is particularly suited for use with thin glass-backed reinforced composite stamps which are designed to be actuated using a vertical displacement motion.

In an embodiment, the invention is a tool apparatus for dry transfer printing comprising a top plate and a mount for operationally connecting a transfer stamp to the top plate. An actuator operationally connected to the top plate is capable of controllably moving the top plate. A micro-chamber, having an internal cavity capable of controllable pressurization and rapid depressurization for exerting a controllable pressure against a transfer stamp top surface when a transfer stamp is operationally connected to the top plate, is formed by the top plate and a top surface of the transfer stamp. The internal cavity has a volume that is variably controlled by the actuator, such as when the actuator is engaged to move the top plate. In this manner the devices and processes provided herein achieve semiconductor pick-up and placement at speeds not reliably achieved with traditional systems that do not manipulated micro-chamber cavity volume.

In an aspect, the tool apparatus has a stamp mounted or connected to the top plate by the mount. The tool apparatus is compatible with any stamps such as stamps known in the art. In an aspect, the stamp is a composite stamp, such as any of the reinforced composite stamps provided in U.S. patent application Ser. No. 12/177,963 (filed Jul. 23, 2008), which is hereby specifically incorporated by reference for the composite and reinforced stamps disclosed therein. For example, the stamp optionally is a reinforced composite stamp comprising a deformable layer having an internal surface and an external surface positioned opposite the internal surface, wherein the external surface comprises a plurality of protrusions, such as a pattern of relief features or printing posts. A stiff support layer is connected or supported by the deformable layer internal surface. A reinforcement layer is at least partially disposed between the deformable layer and the stiff support layer, wherein the reinforcement layer is configured to provide an anisotropic distribution of Young's modulus, flexural rigidity, or stiffness providing vertical flexibility while maintaining in-plane rigidity. In this aspect, the stamp top surface corresponds to at least a portion of the stiff support layer, such that the stiff support layer defines at least a portion of a surface of the micro-chamber internal cavity.

Reinforced composite stamps of certain aspects of the present invention have a composition and architecture optimized for use in printing systems for dry transfer contact printing of semiconductor structures, and imparts excellent control over relative spatial placement accuracy of the semiconductor structures being transferred. In some embodiments, for example, reinforced composite stamps of the present invention allow for precise and repeatable vertical motion of the patterned surface of the printing apparatus with self-leveling of the stamp to the surface of a contacted substrate. Reinforced composite stamps of certain aspects of the present invention achieve a uniform distribution of contact forces between the printing apparatus patterned surface and the top surface of a substrate being contacted by the reinforced composite stamp of the printing apparatus.

Also provided are methods of patterning, assembling and integrating semiconductor elements using reinforced composite stamps and printing devices and systems incorporating the reinforced composite stamps. Process strategies for integrating a thin glass, flexible and high modulus backing into a reinforced composite stamp for printing apparatuses are described. In some embodiments, for example, methods of making reinforced composite stamps impart a degree of flexibility to the sides of the glass backing of the reinforced composite stamp to enable application of an overall uniform vertical pressure by the stamp during dry transfer printing and, thus maintain a planar surface by avoiding large deformation of the glass backing under pressure. Also provided are processes for attaching reinforced stamps to a semiconductor dry transfer printing tool for printing applications. Also provided are processing methods using reinforced composite stamps wherein "step-and-repeat" printing is used to pattern large area substrates with semiconductor structures, including semiconductor devices.

In an embodiment, the stamp further comprises an anti-flexure feature connected to a top face of the stiff support layer. The anti-flexure feature has a geometry and position on the stiff support layer such that bowing of the stamp is decreased, and particularly decreased for relatively large surface area stamps that would otherwise be prone to bowing when subject to external forces such as gravity. Such bowing deformation is undesirable and is preferably minimized or avoided thereby improving alignment, semiconductor pick-up, fidelity, placement accuracy and overall process speed. The anti-flexure feature has any geometric configuration and position that increases the overall stamp flexural rigidity or stiffness while maintaining the ability to facilitate conformal contact with another surface, such as a donor or receiving surface.

Referring further to the tool apparatus, in an embodiment, the mount that connects the stamp to the apparatus is any means for mechanically coupling a stamp to the top plate and/or another component, such as the base plate, as desired. In an embodiment the mount comprises a stamp clamping ring capable of securing a stamp to the top plate. Examples of other mechanical connection means include, but are not limited to, fasteners, connectors, clamps, adhesives, or combinations thereof.

In an embodiment, the tool apparatus further comprises a base plate and the top plate comprises a window actuating fixture and a mounting frame having a first end connected to the base plate and a second end connected to the window actuating fixture. In this embodiment, the stamp is operationally connected to the base plate, such as a surface of the base plate that is the opposite face to the base plate surface connected to the mounting frame. In an embodiment, the micro-chamber internal cavity is formed by the window actuation fixture and the stamp top surface. In an aspect, the window actuating fixture comprises an actuator receiving means that operationally connects the actuator. In this manner, a flexible seal situated between the base plate and the mounting frame permits movement of the top plate while delaying corresponding movement of the stamp, thereby providing volume and corresponding pressure control of the micro-chamber.

In an embodiment, the actuator is capable of varying an internal volume of the micro-chamber, such as under airtight conditions to achieve pressure variation. In an aspect, the device employs a plurality of actuators to achieve precise vertical displacement of the top plate. For example, the window actuating fixture optionally comprises three actuator receiving means, with each actuator receiving means separately operationally connected to an individual actuator. The window actuating fixture may have a geometric shape to provide actuator positioning that is substantially uniform around the top plate, and more particularly, the micro-chamber. In an aspect, the side-walls of the internal cavity formed by the micro-chamber have a geometry that is circular, and the actuators are evenly spaced around the perimeter of the circle. In the embodiment where there are three actuators, for example, they may be spaced outwardly from the origin of the circle in equal radial positions (e.g., 120°), for four they may be positioned every 90°, and so on.

In an embodiment, any of the devices and methods provided herein has a geometrical shape to facilitate optical alignment of the stamp to the donor substrate surface having the semiconductor element. For example, the window actuating fixture may comprise an at least partially optically transparent material that is stiff and is capable of forming an airtight seal during pressurization of the microcavity internal chamber, such as a window portion comprising an optically transparent material.

In an aspect, any of the devices or methods disclosed herein may be further described by one or more parameters, such as, volume, areas, dimensions, placement accuracy, lift-off fidelity, pressure difference (and corresponding force difference) across the stamp (e.g., the pressure difference between the transfer surface and the stamp top surface), separation velocity, and microcavity volume. In an aspect, when the chamber is pressurized at a pressure $P_1$, the internal cavity has a pressurized volume $V_1$ according to:

$$V_1 \geq S \times (h_0 + h_1)$$

where S is the surface area of the stamp backing layer (e.g., the stamp's top surface), $h_0$ is the initial separation distance between the top plate internal surface that forms the top of the micro-chamber internal cavity and the stamp backing top surface, and $h_1$ is the selected stamp pre-alignment distance (when the stamp is brought in proximity to a substrate). In an aspect, the chamber has a maximum volume $V_2$ that occurs when the actuators are energized so that the top plate moves away from the donor substrate surface but that the transfer stamp remains in conformal contact with the donor substrate. At maximum volume, the pressure exerted against the stamp top surface is sufficiently low so that pressure against the transfer surface forces the stamp away from the donor substrate, thereby separating the stamp from the donor substrate. In an embodiment, the pressure against the transfer surface corresponds to ambient or atmospheric pressure. In an embodiment, $V_2$ is sufficiently large to generate a pressure that is less than ambient or atmospheric pressure. The minimum pressure, $P_2$, in the micro-chamber can be estimated using the ideal gas law (PV=nRT=constant (during the process cycle)), so that:

$$P_1 = P_2 \times \left(\frac{V_1}{V_2}\right)$$

The linear throw of the actuators is sufficiently large to insure that the pressure drop $\Delta P = P_2 - P_{ambient}$ in the chamber is greater than the force necessary to separate the stamp from the donor substrate (corresponding to the adhesive force between the contact surface formed between contact of the stamp transfer surface with the semiconductor elements and donor surface). This condition is satisfied when the actuators have a linear throw significantly greater than $h_0 + h_1$. In an aspect, $(h_0 + h_1)$ is less than 1 mm. In that aspect, the actuators have a linear throw that is selected from a range that is greater than or equal to 1 mm and less than or equal to about 5 mm. Accordingly, the distance of actuator travel is selected to provide an appropriate pressure drop across the stamp. In an aspect, the lamination pressure (e.g., internal cavity pressure to establish conformal contact, $P_1$) is selected from a range that is greater than or equal to 0.4 psig and less than or equal to 2 psig, or is about 0.5 psig. In an aspect, the minimum pressure $P_2$ is about 0 psig, or is equal to or less than ambient or atmospheric pressure, such as up to about 0.1 psig below ambient or atmospheric pressure.

In an embodiment, the actuator is capable of moving the top plate at a velocity that is greater than or equal to 5 mm/s. In an aspect, the top plate has a velocity, in a direction away from the base plate that is greater than or equal to 2 mm/s and less than or equal to 10 mm/s.

In an embodiment, any of the tool apparatus provided herein further comprise a passage traversing from an external surface of the top plate to an internal surface of the top plate. A pressure-regulated vacuum source is operationally connected to the passage and is capable of regulating pressure in the internal cavity. A passage inlet valve, or functional equivalent thereof, is provided for forming an air-tight seal within the micro-chamber.

In an embodiment, any of the devices and methods provided herein relate to printing of features on the stamp transfer surface to a receiving surface. In an aspect of this embodiment, the apparatus further comprises a second actuator operationally connected to the top plate or the base plate for generating stamp motion relative to the receiving substrate and in a direction substantially parallel to a plane formed by a transfer surface of the transfer stamp. This is referred to as shear off-set printing.

In an embodiment, the apparatus further comprises a plurality of mechanical spacers connected to an internal surface of the top plate, a top surface of the stamp, or both.

In an embodiment, the apparatus relates to a top plate that is at least partially optically transparent to facilitate alignment of said stamp. In an aspect, the alignment is relative to another surface, such as a substrate surface having a semiconductor element for transfer to the stamp's transfer surface. In this configuration, the picked-up semiconductor element position on the transfer surface is precisely controlled.

In an aspect, $\Delta P$ is selected from a range sufficient to ensure release of the stamp transfer surface from the donor substrate, such as an absolute value of $\Delta P$ that is greater than or equal to 0 psi and typically less than or equal to 0.1 psi, wherein the pressure against the stamp transfer surface is greater than the pressure against the stamp top surface.

In another embodiment, the invention provides processes and methods for transferring or printing of structures, such as semiconductor elements from a donor substrate to a transfer surface, and optionally then to a receiving surface.

In an embodiment, the invention is a method of transferring a semiconductor element from a donor surface to a stamp transfer surface, comprising the steps of providing a tool apparatus for dry transfer printing, such as any of the tool apparatuses disclosed herein. In an aspect, the tool apparatus comprises a top plate, a mount capable of operationally connecting a transfer stamp to the top plate and an actuator operationally connected to the top plate capable of controllably moving the top plate. A transfer stamp is attached to the top plate assembly with the mount. The stamp has a top surface that forms one surface of a pressurizable microchamber having an internal cavity. A donor substrate surface comprising or supporting a semiconductor element is provided and the stamp transfer surface is aligned with the donor substrate surface. "Alignment" or "aligning" refers to horizontally aligning the transfer and substrate surfaces in a desired configuration, and bringing the surfaces in proximity with one another. In an aspect, proximity refers to within about 500 μm, within about 200 μm, within about 100 μm or less of the other surface, and any subcombinations thereof. The internal cavity is pressurized, thereby establishing conformal contact between the stamp transfer surface and the donor substrate surface, the semiconductor element, or both. The internal cavity pressure is then decreased, wherein the decrease in internal cavity pressure is achieved by forming an air-tight seal around the micro-chamber cavity and increasing the cavity volume by activating the actuator to move the top plate in a direction that is away from the donor substrate, thereby transferring the semiconductor element from the donor surface to the stamp transfer surface.

In an embodiment, any of the devices or methods has a stamp, such as a stamp that is a composite stamp. In an aspect, the composite stamp comprises a deformable layer having an internal surface and an external surface positioned opposite the internal surface, wherein the external surface comprises a plurality of protrusions, such as printing posts. A stiff support layer is connected to the deformable layer internal surface. A reinforcement layer is at least partially disposed between the deformable layer and the stiff support layer, wherein the reinforcement layer is configured to provide an anisotropic distribution of Young's modulus, flexural rigidity, or stiffness providing vertical flexibility while maintaining in-plane rigidity. In this aspect, the stamp top surface corresponds to at least a portion of the stiff support layer, such as defining a surface of the micro-cavity chamber.

In an embodiment, the top plate further comprises a micro-chamber inlet port for controllably pressurizing the internal cavity. In an aspect of this embodiment, the method relates to establishing conformal contact between the transfer stamp receiving surface with the donor substrate surface, closing the micro-chamber inlet port, thereby forming an air-tight seal around the internal cavity of the micro-chamber and activating the actuator to move the top plate in a direction that is away from the donor substrate. In this manner, for the time period where the top plate moves and the transfer surface remains in contact with the donor substrate surface, there is an increase in the internal cavity volume and corresponding decrease in the internal cavity pressure. Once the pressure difference across the stamp reaches a separation value, the stamp transfer surface separates from the donor substrate surface. In other words, the stamp is pushed off the donor substrate rather than pulled as generally occurs in traditional processes.

In an embodiment, any one or more physical parameters may be used to further describe the invention. Examples of parameters of interest include, but are not limited to, separation speed, pressure against the stamp back face, pressure against the stamp transfer surface, pressure difference across the stamp (between the transfer surface and the stamp top surface), micro-chamber internal cavity volume, and time courses thereof. In an embodiment, the top plate is moved away from the substrate at a separation speed, wherein the separation speed is greater than or equal to 50 mm/s, or with a peak acceleration, such as a peak acceleration that is greater than or equal to 10 m/s$^2$.

In an embodiment, the method further relates to providing a receiving surface, aligning the stamp transfer surface having the semiconductor element the said receiving surface, establishing conformal contact between at least a portion of the transfer surface and the receiving surface and transferring the semiconductor element from the transfer surface to the receiving surface. In a further embodiment, the transferring step comprises offsetting the transfer stamp a horizontal distance relative to the receiving surface, thereby generating an in-plane shear force in said stamp, and separating the stamp from the receiving surface by moving the stamp in a vertical direction relative the substrate, thereby printing the semiconductor element to the receiving surface. In an aspect, the horizontal offset is accomplished by any of the embodiments provided in U.S. Provisional Patent Application No. 61/116, 136 filed Nov. 19, 2008 titled "Printing Semiconductor Elements by Shear-Assisted Elastomeric Stamp Transfer", which is specifically incorporated by reference to the extent it is not inconsistent herewith.

Provided are methods and systems for dry transfer printing of semiconductors and semiconductor elements by shear offset. Shear offset printing systems permit higher delamination rates to be achieved during transfer printing without sacrificing printing yield or accuracy, compared to traditional techniques that do not apply a shear offset. Accordingly, methods and systems presented herein provide faster and more reliable transfer printing, thereby reducing processing time and increasing printing efficiency.

Increasing shear offset during the delamination process increases transfer yields. Shear offset causes mechanical deformations in the transfer stamp used to transfer the semiconductor elements and, thereby, lowers the energy required to initiate delamination of the transfer stamp surface from the semiconductor element.

In an aspect, the invention is a method of printing a transferable semiconductor element, such as by providing an elastomeric stamp having a transfer surface. A semiconductor element is supported by the transfer surface. To further increase control and printing yield, the transfer surface that supports a semiconductor element may have a three-dimensional pattern of relief features that at least partially contacts the semiconductor element. The stamp "inked" with a semiconductor element is brought into conformal contact with a receiving surface, such that at least a portion of a semiconductor element contacts the receiving surface. The receiving surface is optionally at least partially coated with an adhesive layer. Alternatively, the receiving surface is not coated with an adhesive. Alternatively, the receiving surface is patterned with a pattern of adhesive regions. The elastomeric stamp is offset a horizontal distance relative to the receiving surface, thereby generating a mechanical deformation in at least a portion of the pattern of relief features, wherein the offset does not separate the semiconductor element from the transfer surface or the receiving surface. The location that drives the offset is not important (e.g., one or both of stamp and receiving surface may be offset), as long as there is an offset between the receiving surface and transfer surface. "Horizontal offset" refers to an offset that is substantially parallel to the plane or surface defined by contact between the inked contact surface and the receiving substrate. The stamp is separated from the receiving surface, thereby printing the semiconductor element to the receiving surface.

Offsetting may be by any means known in the art, so long as the end result is the movement of the transfer surface relative to the receiving surface. In an embodiment, the offsetting is by application of an in plane displacement to the elastomeric stamp. In an embodiment, the in plane displacement is achieved by a horizontal displacement of the stamp top surface relative to the receiving surface that is greater than 5 µm and less than 100 µm.

In an aspect, any of the methods provided herein further include mounting an elastomeric stamp to a dry transfer printing tool. The offset step is optionally accomplished by applying an in plane displacement to the dry transfer printing tool, thereby generating a mechanical deformation of at least a portion of the relief features. "In plane displacement" refers to offset that is in a substantially parallel direction to the interface that will be undergoing delamination. In this aspect, "substantially parallel" refers to a direction that is within 2° of the surface or planed defined by the interface.

In an embodiment, the device supports a reinforced composite stamp having a deformable layer with an internal surface and an external surface positioned opposite the internal surface, the external surface of the deformable layer having a plurality of relief features. A stiff support layer is connected to the internal surface of the deformable layer, wherein the stiff support layer has a bottom surface and a top surface positioned opposite the bottom surface, wherein the bottom surface is positioned proximate to the internal surface of the deformable layer. A reinforcement layer is operably connected to the stiff support layer, the reinforcement layer having an opening that vertically coincides with at least a portion of the relief features of the external surface of the deformable layer. In an embodiment, the composite stamp is supported by a vertical section that operably connects a mounting flange to the deformable layer external surface. A transfer printing tool head having a receiving surface connects the mounting flange top surface. An actuator is operably connected to the mounting flange or the transfer printing tool head for generating a horizontal displacement between the deformable layer internal surface and the receiving surface. Accordingly, the actuator may displace the stamp or the receiving substrate, thereby achieving offset between the stamp and the receiving substrate.

Any of the methods and devices provided herein is optionally used to simultaneously transfer a plurality of semiconductor elements to the transfer surface. "Simultaneously transfer" refers to one transfer stamp surface/donor substrate surface conformal contact resulting in a plurality of elements transferred and reflects that depending on the stamp mechanics and related forces, the elements may not transfer exactly simultaneously.

In an embodiment, the process may be tailored to reduce the time required for the system to achieve pressure equilibrium in the internal cavity after transfer has occurred, such as by providing a negative pressure relative to ambient pressure in the internal cavity after the semiconductor element is transferred. Such reduction in time decreases the wait time required to then print the transferred features, resulting in over-all improved processing and print speed.

In another aspect, any of the methods and devices further relates to an anti-flexure feature that provides further flexural rigidity to the transfer stamp. In an aspect, the anti-flexure feature provides substantially parallel alignment between the stamp transfer surface and the donor and/or receiving substrate surface, such as a deviation that is less than 50 µm or less than 5 µm from an average separation distance between the facing surfaces. In an aspect, the transfer printing tool comprises a top plate, a stamp having an elastomer layer supported by a stiff support layer, an antiflexural feature connected to the stiff support layer, a mount for securing the stamp to the top plate, and a microchamber having an internal cavity formed from the top plate and the stamp top surface.

Without wishing to be bound by any particular theory, there can be discussion herein of beliefs or understandings of underlying principles or mechanisms relating to embodiments of the invention. It is recognized that regardless of the ultimate correctness of any explanation or hypothesis, an embodiment of the invention can nonetheless be operative and useful.

DETAILED DESCRIPTION OF THE INVENTION

Figure 1:
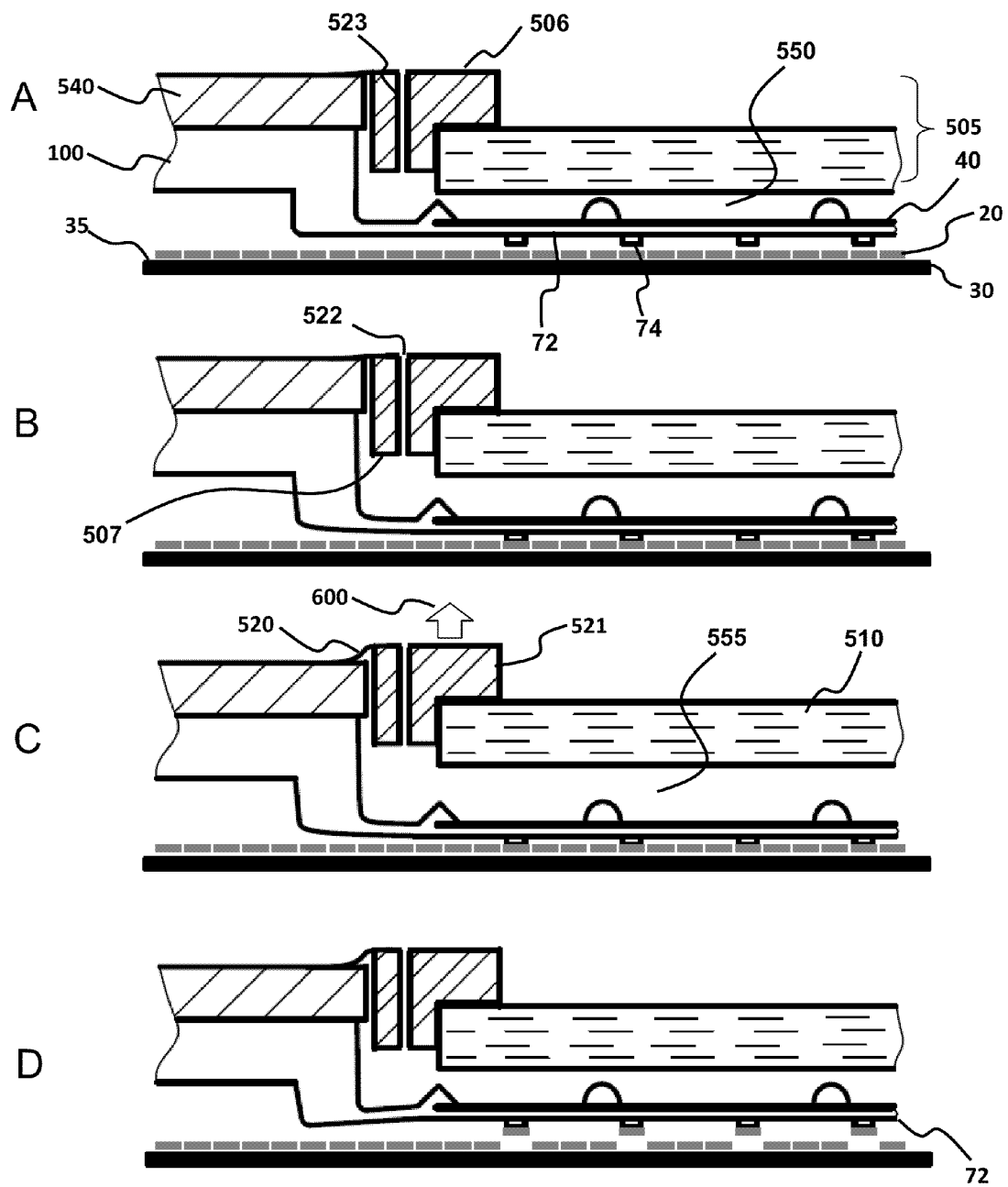
FIG. 1 is a process flow diagram with cross-section schematic views illustrating the steps to pickup semiconductor elements from a donor substrate using a vacuum coupled tool apparatus. Steps include: A Align transfer printing stamp; B Pressurize tool apparatus micro-chamber to laminate transfer printing stamp onto donor substrate; C Raise micro-chamber window to induce abrupt pressure drop inside tool apparatus micro-chamber; D Resulting differential pressure forces on the transfer printing stamp cause fast vertical motion of the transfer printing stamp away from the donor substrate. An array of semiconductor elements are picked-up from the donor substrate and transferred to the stamp printing posts.

"Printing" refers to a process of transferring a feature, such as a semiconductor element, from a first surface to a second surface. In an aspect, the first surface is a donor surface and the second surface a receiving surface, and the transfer is mediated by an intermediate surface such as a stamp having a transfer surface. In an aspect, the first surface is a transfer surface on a stamp to which one or more semiconductor elements are supported, and the stamp is capable of releasing the elements to a receiving surface on a receiving substrate, thereby transferring the semiconductor element.

"Stamp" refers to a component for transfer, assembly and/or integration of structures and materials via printing, for example dry transfer contact printing. Composite stamps, such as composite stamps disclosed in Ser. No. 12/177,963, filed Aug. 29, 2008, hereby incorporated by reference, are particularly useful for pickup and release/print systems, wherein the stamp can be first laminated or contacted with a donor substrate to pickup micro or nanostructures from that donor substrate and subsequently brought into contact with a receiving substrate to which it transfers the micro- or nano-structures.

"Composite stamp" refers to a stamp having more than one component, such as more than one material. In an aspect, a composite stamp is made from a deformable layer and a stiff support layer, wherein the deformable and support layers have different chemical compositions and mechanical properties. The deformable layer optionally comprises a composite polymer layer, such as a reinforcement layer having a combination of one or more polymer and a fiber, such as a glass or elastomeric fiber, particulate, such as nanoparticles or microparticles or any combinations thereof.

"Stiff" is used synonymously with rigid and refers to a mechanical property of a layer of the composite stamp that constrains in-plane deformation and unwanted motion of the deformable layer during any stage of transfer printing. For example, a stiff support layer that is operably connected to the deformable layer permits vertical flexibility of the deformable layer and also minimizes unwanted in-plane motion, and more specifically unwanted in-plane deformation, of the deformable stamp. "In plane" refers to a plane that is parallel to a plane defined by the printable area of the composite stamp. "Vertical" refers to a direction that is orthogonal to the plane defined by the printable area of the composite stamp.

As used herein the expression "semiconductor element" and "semiconductor structure" are used synonymously and broadly refer to a semiconductor material, structure, device and/or component of a device. Semiconductor elements include high quality single crystalline and polycrystalline semiconductors, semiconductor materials fabricated via high temperature processing, doped semiconductor materials, organic and inorganic semiconductors and composite semiconductor materials and structures having one or more additional semiconductor components and/or non-semiconductor components, such as dielectric layers or materials and/or conducting layers or materials. Semiconductor elements include semiconductor devices and device components including, but not limited to, transistors, photovoltaics including solar cells, diodes, light emitting diodes, lasers, p-n junctions, photodiodes, integrated circuits, and sensors. In addition, semiconductor element refers to a part or portion that forms an end functional semiconductor.

"Semiconductor" refers to any material that is a material that is an insulator at a very low temperature, but which has an appreciable electrical conductivity at a temperatures of about 300 Kelvin. In the present description, use of the term semiconductor is intended to be consistent with use of this term in the art of microelectronics and electronic devices. Semiconductors useful in the present invention may comprise element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electronic properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light emitting materials, such as light emitting diodes (LEDs) and solid state lasers. Impurities of semiconductor materials are atoms, elements, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

"Relief features" refer to protrusions, extensions or projections on the bottom surface or external surface of the deformable layer, such as a three-dimensional relief pattern, that facilitates dry-transfer printing of semiconductor elements from a donor substrate to a receiving substrate. In an aspect, the relief features of the deformable layer define a printable surface area. "Printable surface area" or "region" refers to that portion of the stamp used to transfer structures from a donor substrate to a receiving substrate. "Active surface region" is used interchangeably with "printable surface region." A "pattern of relief features" refers to a plurality of features, including a plurality of microstructures, such as an array of features. The relief features may in turn be made from a plurality of distinct populations, with each population designed to serve a specific function. For example, one population may comprise printing posts for facilitating pickup and release of semiconductor elements. Another population may comprise stability features for ensuring the stamp does not sag, buckle or otherwise undergo unwanted deformations during lamination and/or delamination with the donor or receiving substrate surface. In an aspect, each population has different geometry, dimensions such as height, length or width, or is made from a material resulting in, for example, a different physical parameter such as an effective Young's modulus for that population. In an aspect, a population comprises a plurality of sub-populations.

"Lamination" refers to the process of bonding layers of a composite material or a process of producing contact between a first material or layer and a second layer or material (e.g., such as between the stiff backing and reinforcement layer, stiff backing and deformable layer, reinforcement layer and deformable layer, semiconductor element and transfer surface or receiving surface, for example). "Delamination" refers to the stamp transfer surface-semiconductor element separation or the stamp transfer surface-receiving substrate separation.

"Pickup rate" refers to the vertical separation rate (or speed) at which the stamp is separating from a donor substrate. In particular, for embodiments where the stamp has relief features that are printing posts inked with semiconductor elements, pickup rate also refers to the vertical separation rate of the semiconductor elements. Pickup rate may refer to a single post or semiconductor element separating from a donor substrate. Alternatively, pickup rate rate may refer to a spatially-averaged rate for all stamp posts and semiconductor elements located within the surface region defined by the stamp printing posts array.

With respect to depressurization of the microchamber, the term "rapid" refers to the capability of the system to quickly generate changes in the pressure of the microchamber's internal cavity. In an aspect, rapid refers to the ability to change the microchamber internal cavity pressure from a maximum value (e.g., a lamination pressure of up to about 0.4 psig to 2 psig) to a minimum value (e.g., a pressure sufficiently low to achieve separation of the transfer stamp surface from the donor substrate surface, such as about −0.1 psig). In an aspect, rapid refers to a change from maximum to minimum pressure that occurs over a time range that is less than or equal to about 50 ms, or that is selected from a range that is greater than or equal to 10 ms and less than or equal to 40 ms, or that is about 20 ms. In an aspect, rapid may be defined as a rate of pressure change, such as a rate that is about 2 psi/20 ms (e.g., 100 psi/s), or a rate that is selected from a range that is greater than or equal to about 50 psi/s and less than or equal to about 150 psi/s.

"Substrate" refers to a structure or material on which, or in which, a process is conducted, such as patterning, assembly and/or integration of semiconductor elements. Substrates include, but are not limited to: (i) a structure upon which semiconductor elements are fabricated, deposited, transferred or supported; (ii) a device substrate, for example an electronic device substrate; (iii) a donor substrate having elements, such as semiconductor elements, for subsequent transfer, assembly or integration; and (iv) a receiving substrate for receiving printable structures, such as semiconductor elements.

"Placement accuracy" refers to the ability of a pattern transfer method or device to generate a pattern in a selected region of a substrate. "Good placement" accuracy refers to methods and devices capable of generating patterning in a select region of a substrate with spatial deviations from the absolutely correct orientation less than or equal to 5 microns, particularly for generating patterns of semiconductor elements on receiving substrates.

"Operationally connected" refers to a configuration of elements such as layers and/or device components, wherein an action or reaction of one element affects another element, but in a manner that preserves each element's functionality. Operationally connected device components refers to an arrangement wherein a force applied to a layer or device component is transmitted to another layer or device component. Operationally connected layers or device components may be in contact, such as layers having internal and/or external surfaces in physical contact. Alternatively, operationally connected layers or device components may be connected by one or more connecting layers or intervening components. As used herein, a stamp that is operationally coupled to a top plate refers to the stamp and top plate that are vacuum coupled to one another. For example, the top plate may be moved in a direction that is away from the stamp for a certain distance without forcing a stamp that is in contact with a donor surface from moving. At a certain distance, however, the top plate is moved sufficiently far from the stamp that the corresponding pressure exerted against the stamp top surface is sufficiently low so that the stamp is forced away from the donor substrate by the pressure-exerted force against the stamp transfer surface. Accordingly, the operationally connected stamp and top plate are said to be vacuum coupled. The stamp may also be connected to another component, such as mounted to a base plate, wherein the stamp remains operationally connected to the top plate.

The invention may be further understood by the following non-limiting examples. All references cited herein are hereby incorporated by reference to the extent not inconsistent with the disclosure herewith. Although the description herein contains many specificities, these should not be construed as limiting the scope of the invention but as merely providing illustrations of some of the presently preferred embodiments of the invention. For example, thus the scope of the invention should be determined by the appended claims and their equivalents, rather than by the examples given.

Example 1

Vacuum-Coupled Tool Apparatus

FIG. 1 illustrates the process flow steps to pickup semiconductor elements 20 from a donor substrate using a vacuum coupled tool apparatus. First the stamp is brought into close proximity (i.e. within <100 µm) to a donor substrate surface 35 (FIG. 1A). After precise optical alignment of the stamp 100 to the donor substrate 30, the tool apparatus micro-chamber 550 is pressurized. The gas pressure induces a uniform pressure on the stamp backing top surface 40 and brings a stamp transfer surface 72 having relief features or protrusions 74, such as stamp printing posts, into conformal contact with semiconductor elements 20, illustrated as an array of semiconductor elements, defined on the top surface 35 of the donor substrate 30 (FIG. 1B). A passage 523 traverses from external surface 506 to internal surface 507 of top plate 505. The micro-chamber inlet port 522 seals microchamber 550, and a linear actuator is then energized to quickly lift the top plate 505, including an optically-transparent window 510, and mount 521 (as indicated by the arrow 600 of FIG. 1C) that operationally connects the stamp 100 to the window 510. Sudden increase of the micro-chamber 550 internal cavity volume 555 by movement 600 and flexible seal 520 induces an abrupt pressure drop in the micro-chamber 550 (see also FIG. 5). The resulting pressure difference between the pressure exerted against stamp transfer surface 72 and against stamp top surface 40 causes the stamp with the semiconductor elements to separate from the donor substrate and follow the vertical motion of the top plate 505. In other words, the transfer printing stamp 100 is vacuum coupled to the top plate 505 of the tool apparatus. (FIG. 1D). During this fast separation step, an array of semiconductor elements 20 are picked-up from the donor substrate 30 and transferred the stamp transfer surface 72, such as to the stamp printing posts 74. Non contact position measurements collected using a high sampling rate laser distance sensor indicate that the linear actuators (such as solenoids) are capable of lifting the top plate 505 subassembly at speeds over ~80 mm/s and peak accelerations reaching over 15 m/s$^2$. However, as the aspect ratio of the gas film located between the stamp and the donor substrate is high, squeezed film damping takes place and limits the maximum stamp pickup rate. Once the stamp is populated with an array of semiconductor elements, the stamp is moved and aligned onto a receiving substrate. The semiconductor elements are then transferred onto the surface of the receiving substrate, such as by following shear offset printing procedures described in U.S. Pat. App. 61/116,136, filed Nov. 19, 2008 titled "PRINTING SEMICONDUCTOR ELEMENTS BY SHEAR-ASSISTED ELASTOMERIC STAMP TRANSFER" (herein specifically incorporated by reference to the extent not inconsistent herewith). U.S. Pat. App. 61/116,136 also describes different methods for attaching the transfer printing stamp 100 to the tool head base plate 540. These alternative attachment methods are compatible with the vacuum coupled tool apparatus presented herein, and are specifically incorporated by reference.

Figure 2:
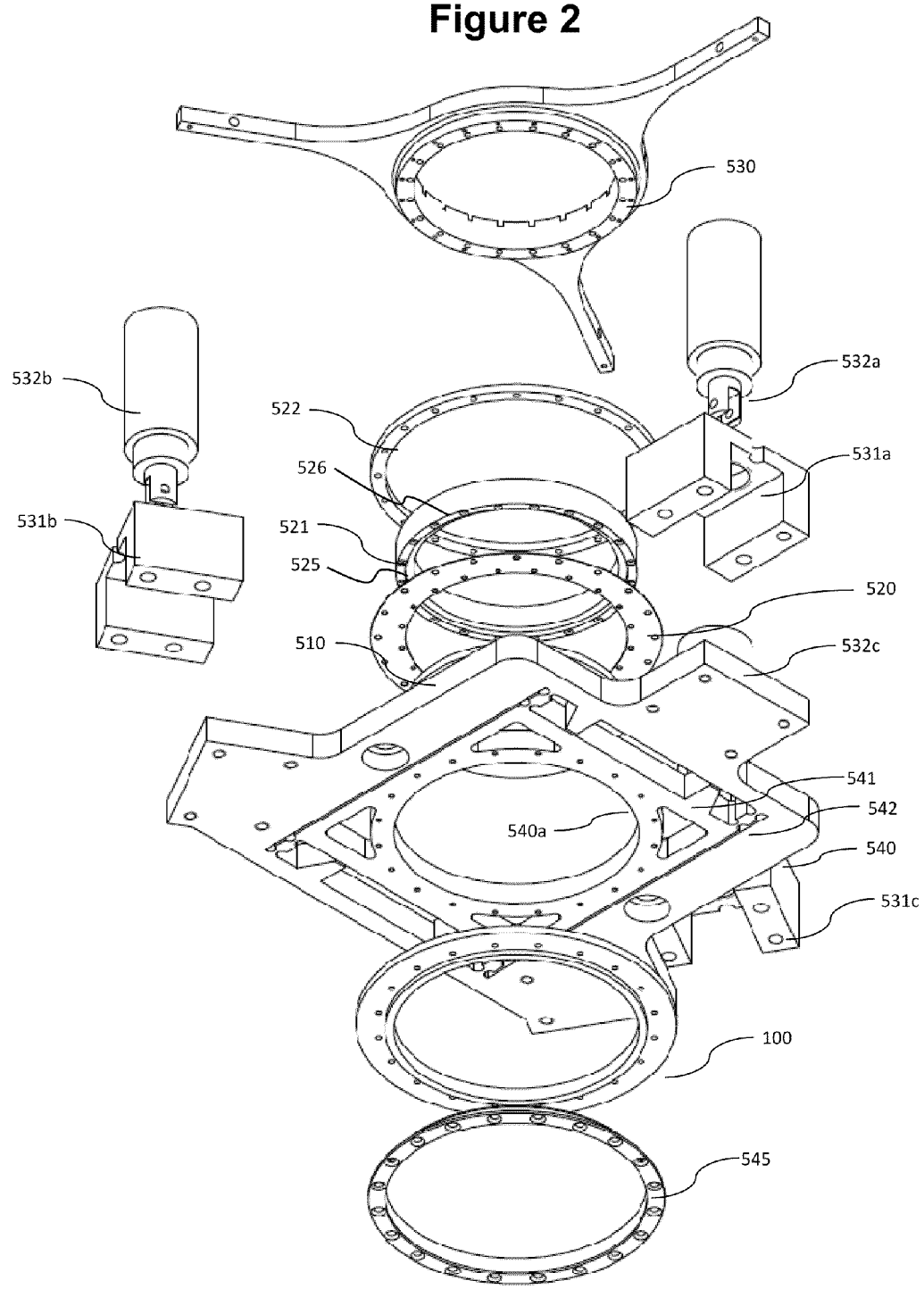
FIG. 2 provides an exploded view of a vacuum coupled tool apparatus for dry transfer printing semiconductor elements.
Figure 3:
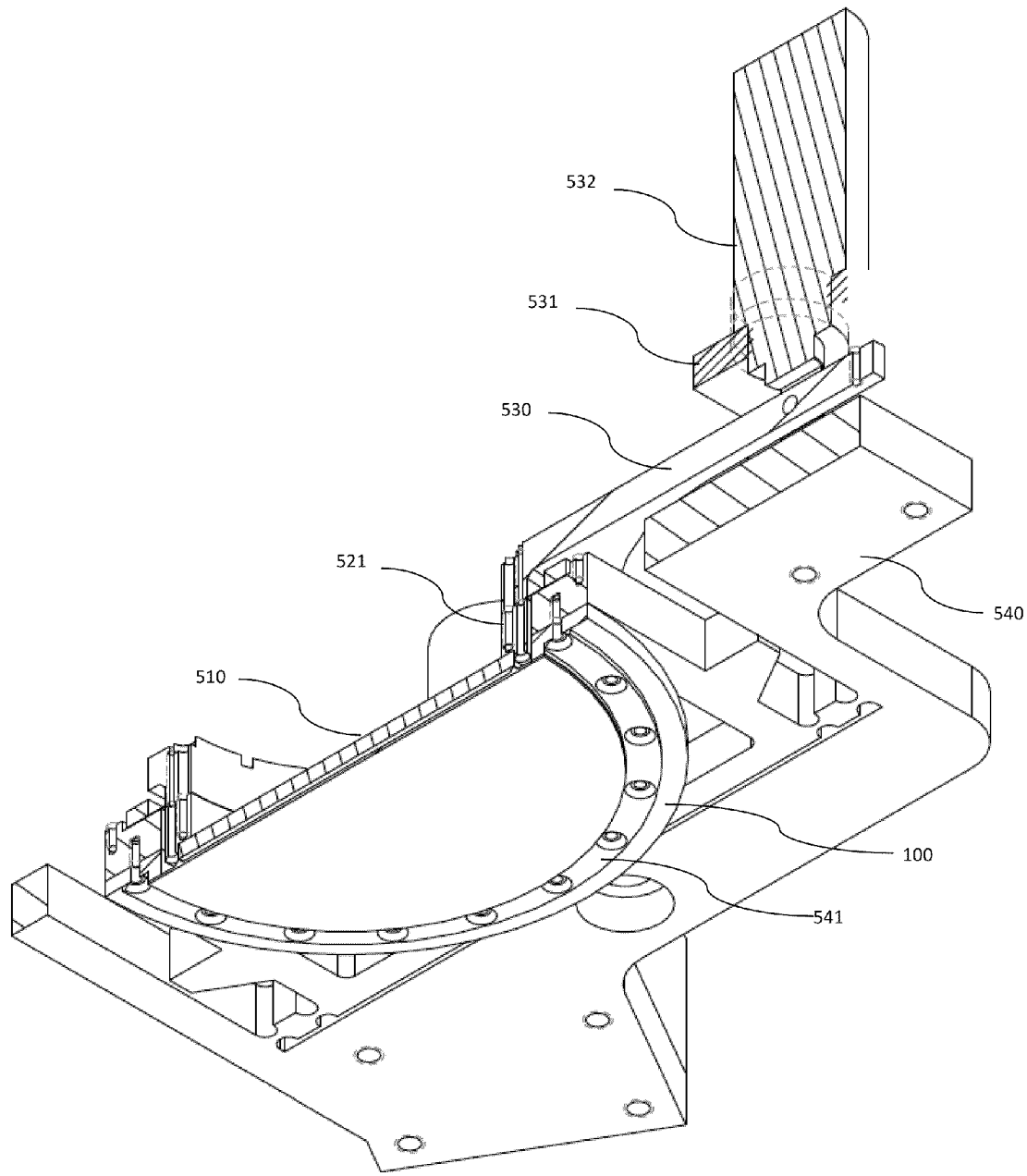
FIG. 3 provides a schematic cross-section view of a vacuum coupled tool apparatus for dry transfer printing semiconductor elements.

One embodiment of a mechanical design of the vacuum coupled tool apparatus is presented in FIGS. 2 and 3. FIG. 2 is an exploded view of an exemplary design of the parts which can be mechanically assembled to form a vacuum coupled tool apparatus. FIG. 2 shows a mount 545 (e.g., a stamp clamping ring) that mounts a transfer printing stamp 100 onto the tool apparatus base plate 540. A set of three linear (solenoid) actuators 532a-c is operationally connected to the base plate 540 and to the top plate window 510, such as by actuator receiving means 531a-c, shown in this embodiment as mounts comprising metal brackets. In this manner, stamp 100 is operationally connected (e.g., vacuum coupled) to the top plate, and specifically the window, wherein a change in volume of microchamber 550 (formed between top surface of stamp 100 and bottom surface of top plate 510), leads to change in pressure and therefore force exerted against stamp top surface. The linear actuators 532 are also operably connected to the window actuating fixture 530. In this example, the top plate 505 is made of a plurality of individual elements: a flexible seal ring 520 is mechanically clamped between the base plate 540 and the window actuating fixture 520 and the tool apparatus window 510 and mounting frame 521 subassembly; a metal clamping ring 522 clamps (and seals) the flexible seal ring 520 to the tool apparatus base plate 540. The mounting frame 521 has a first end 525 connected to the base plate 540 via window 510 and a second end 526 connected to the window actuating fixture 530. Optionally, eight mechanical hinges 542 are defined in the tool apparatus baseplate 540 to provide a non-amplified single axis linear motion. Fast response piezo-driven actuators can be press fit mounted between the baseplate slots 541 to provide fast horizontal linear motion of the baseplate mounting flange 540a. A cross section view of the assembled tool apparatus parts is presented in FIG. 3.

Figure 4:
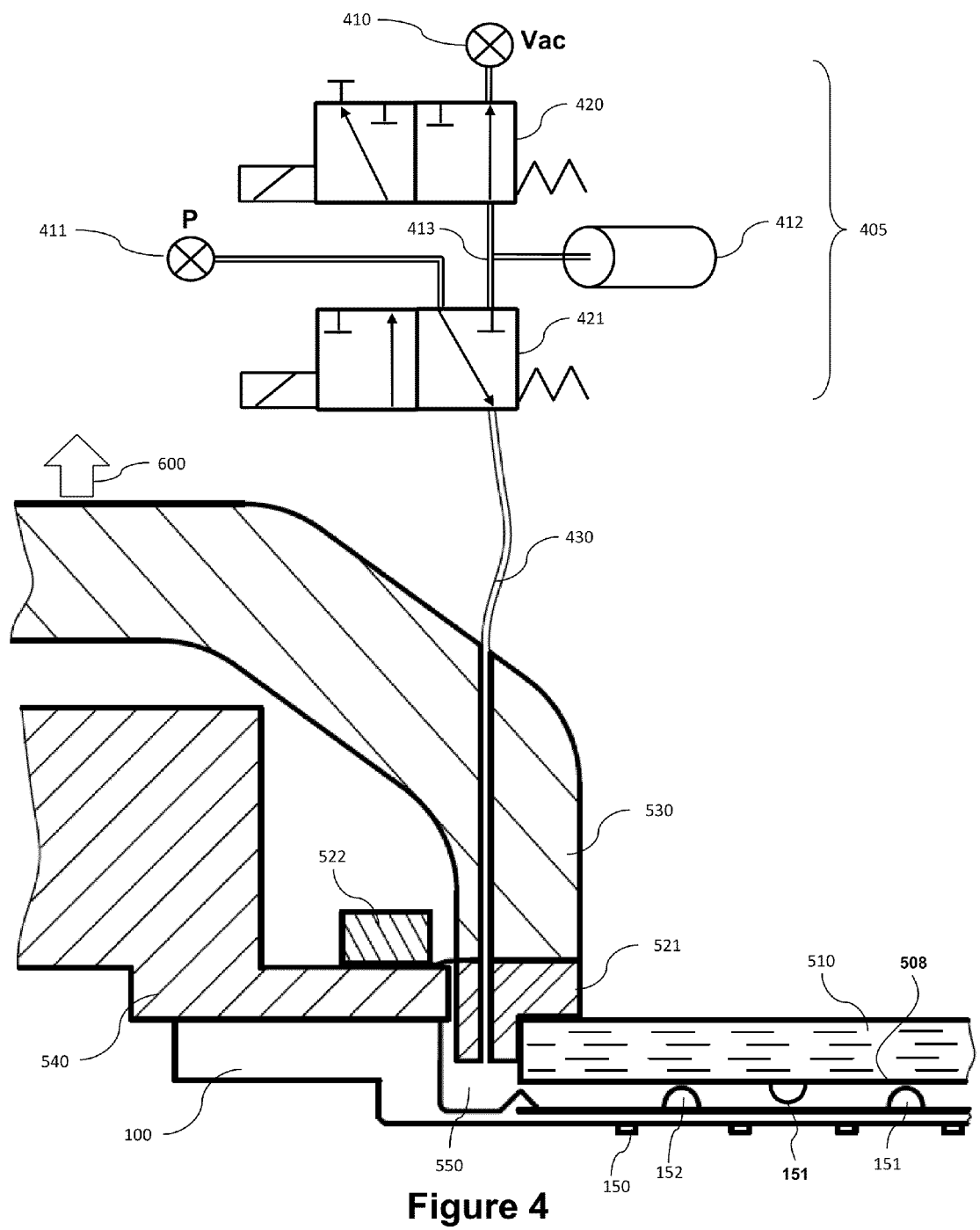
FIG. 4 provides a cross-section view of a vacuum coupled tool apparatus connected, through pneumatic valves, to vacuum and pressure regulated lines.

FIG. 4 provides a simplified detailed cross-section view of a vacuum coupled tool apparatus connected to a pressure-regulated vacuum source 405. In the embodiment shown in FIG. 4, the pressure-regulated vacuum source comprises pneumatic valves 420-421, vacuum source 410 and pressure regulator 411 and various conduits 413. In one embodiment, a reservoir 412 can be inserted between the two pneumatic valves 420 and 421. In this configuration, an optimized actuation sequence can be followed. i) First, the reservoir 412 is purged as the pneumatic valve 420 connects the line 413 to the vacuum source 410. The pneumatic valve 421 connects the pressure line 430 and micro-chamber 550 to the pressure regulator 411 and functions as a passage inlet valve that is capable of forming an air-tight seal within the microchamber. The pressure regulator may comprise any source that is capable of controllable and adjustable pressurization. In an embodiment the pressure regulator consists of a remotely controlled electronic pressure regulator connected to a compressed nitrogen line (regulated in amount by a standard diaphragm type pressure regulator). ii) After expiration of a pressure stabilization delay, the pneumatic valve 420 is actuated. In this second valve position, the vacuum line 413 is closed. iii) Immediately after actuation of the linear actuator 600, the pneumatic valve 421 is actuated. In this second valve position, the pressure line 430 and micro-chamber 550 are connected to the pressure line 413 and reservoir 412. In the embodiment where a reinforced composite stamp is mounted on the tool apparatus, the stamp backing layer is connected to the tool apparatus base plate 540 through a compliant fiberglass reinforced ring. After complete separation of the stamp 100 from the donor substrate, the vacuum-coupling facilitates final pressure in the micro-chamber 550 to be considered equal to the ambient atmospheric pressure. Therefore, the total vertical displacement of the stamp can be adjusted by optimizing the size of the reservoir 412 and the vertical displacement of the linear actuator 600. It is important to note that the stamp fast separation is mostly provided by the displacement of the micro-chamber window 510, and not by the (significantly slower) partial purge of the micro-chamber when the valve 421 connects the micro-chamber to the (vacuum) reservoir 412. The reservoir 412 principal function is to assure that the stamp conserves a planar shape after completion of the stamp separation step and more rapid equilibration of the micro-chamber pressure. Optionally, the internal surface 508 of the top plate (such as micro-chamber window 510) and/or the stamp top surface 40 are populated with an array of mechanical spacers 151 to control the minimum separation distance between these two parts. Anti-flexure features 152 may be positioned on the stiff layer top surface to facilitate maintenance of the stamp in a planer or substantially planar configuration. iv) Finally, the linear actuator 600 and the pneumatic valve 421 are deactivated, and return to their initial position and ready for the next print step or cycle. The pressure source 411 is adjusted to control the final shape of the stamp. Preferably, the pressure source 411 is configured to provide control over a pressure range going slightly (i.e. ~−0.01 PSIG) below atmospheric pressure. Supplying a negative pressure to the micro-chamber can help to overcome the effect of gravity and maintain the stamp in a planar configuration. When the pressure source provides a sufficiently negative pressure, the stamp can rest again the mechanical spacers 151. This rest position provides reduced stabilization time, thereby decreasing process time to provide an improvement in the overall system throughput not achieved with traditional systems and devices.

Figure 5:
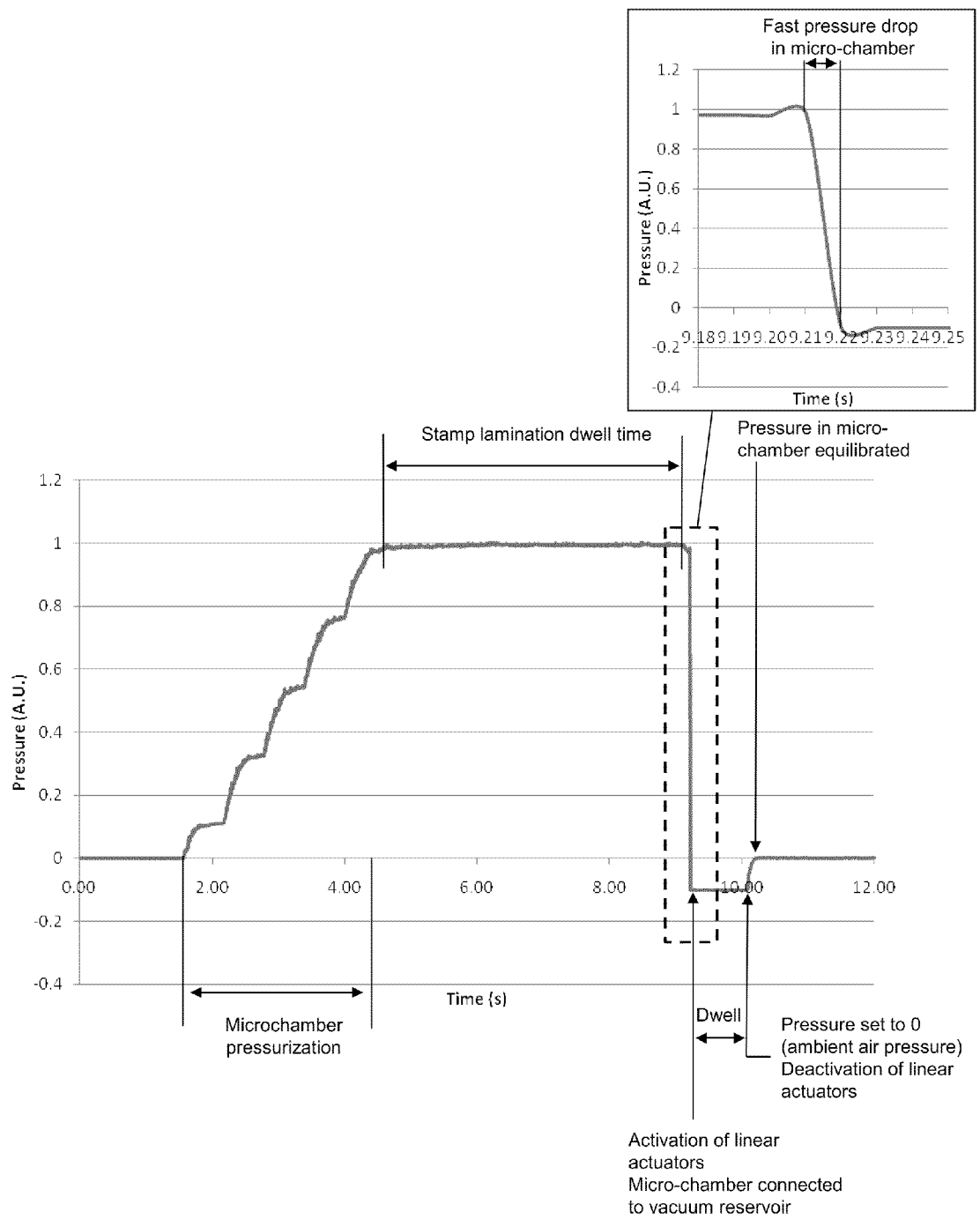
FIG. 5 is an exemplary pressure cycle in the microchamber during a semiconductor pick-up step. The graphical inset is an expanded view of the portion of the pressure cycle related to the activation of linear actuators that results in rapid depressurization of the micro-chamber.

One example of micro-chamber pressure during a transfer cycle is provided in FIG. 5. Such a pressure time-course reflects that the microchamber 550, and specifically internal cavity 555 is capable of controllable pressurization. The data are obtained from an analog output pressure sensor mounted near the inlet port of the micro-chamber. Initially, the micro-chamber is pressurized to provide conformal contact between the stamp transfer surface and the donor substrate having one or more semiconductor elements capable of transfer. Conformal contact is maintained for a certain time period, referred to in FIG. 5 as the stamp lamination dwell time. In this example, the micro-chamber is maintained at a maximum and constant pressure during this dwell time. The micro-chamber is sealed and linear actuators are energized to increase the micro-chamber volume, thereby resulting in a well-defined and rapid pressure decrease in the micro-chamber. The micro-chamber is optionally unsealed, such as by the scheme summarized in FIG. 4, to provide rapid pressure equilibration and the linear actuators are deactivated. In an aspect, the micro-chamber pressure is optionally set slightly negative compared to surrounding ambient pressure (e.g., air pressure) for a certain time period and then the pressure in the micro-chamber is equilibriated to ambient air pressure or to whatever pressure is desired. In this manner, the decrease in time required to reach equilibration is reflected in improved cycle or processing time.

Figure 6:
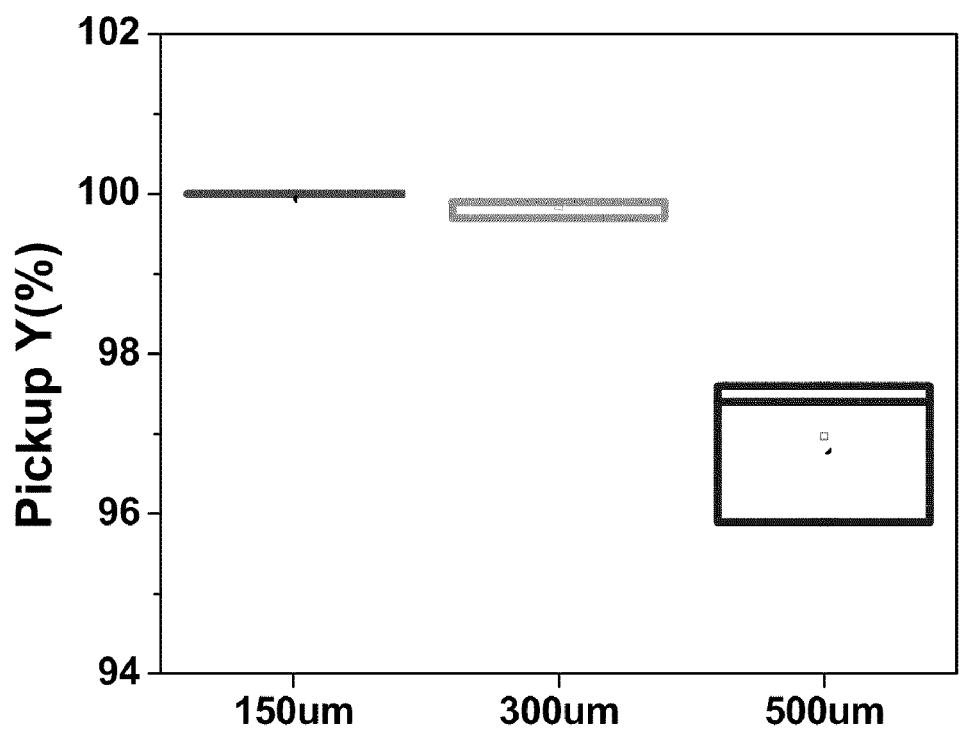
FIG. 6 illustrates the effects of composite stamp stiff backing thickness, glass in this example, on transfer yield.

One aspect of the invention provided herein relates to the thickness of the stiff backing used in a composite stamp, and more specifically to the thickness being selected from a range that provides high pick-up and/or release. As indicated in FIG. 6, an important feature of the processes and devices disclosed herein is the use of a relatively thin layer of a glass backing in the composite stamp. As the thickness of the stiff backing layer increases, the pickup efficiency decreases. Accordingly, it is important to use an ultra-thin stiff (e.g., glass) backing layer in order to obtain a uniform lamination pressure across the stamps, and thus achieve high pick-up yields. Thicknesses less than or equal to about 400 µm are capable of providing a pickup yield that is greater than about 98% (e.g., the percentage of semiconductor elements that are transferred to the stamp transfer surface). In an aspect, the thickness of the stiff backing layer corresponds to a thickness that provides at least 95%, at least 98%, or at least 99% pickup yield. In an aspect, the thickness of the stiff glass backing layer is selected from a range that is greater than or equal to 100 µm and less than or equal to 400 µm. Additionally, the use of thinner stiff or stiff backing layers result in an overall reduction of the composite stamp flexural rigidity which facilitates transfer printing onto uneven surfaces (such as plastic substrates). There is, however, a trade-off as further decrease in the stiff back layer of the stamp leads to an increased tendency for stamp bowing, especially during rapid pressure cycling in the microchamber formed by the stiff back layer. To reduce bowing or flexural concerns, anti-flexure features may be placed on the stamp top surface of the stiff layer. Examples of anti-flexure features include, but are not limited to a single layer, multi-layers or composite material relying on lines, grids, or other 2D or 3D shaped features to provide increased rigidity to the stamp. Alternatively, the feature may be embedded in the stiff layer itself, such as reinforcing stiff elements like metal strips or particles that impart increased rigidity to the thin stiff layer.

FIG. 7A provides experimental measurements of vertical motion and velocity of the tool apparatus top plate and a composite stamp as a function of time. These experimental data are recorded using a non-contact laser distance sensor positioned vertically above the tool apparatus. An array of small metal marks (2×2 mm in size) are patterned on the top surface of the composite stamp glass reinforcement layer in order to reflect the laser beam of the displacement sensor. The laser beam is transmitted through the transparent window (510) of the tool apparatus and then reflected by the metal mark located at the center of the composite stamp top surface. In this experiment, the composite stamp is laminated against a bare silicon substrate. The tool apparatus micro-chamber is pressurized to 0.5 PSIG prior to actuating the linear solenoid actuators (532). FIG. 7B provides the vertical peel speed of the top plate and of the composite stamp calculated by derivation of the motion curves provided in FIG. 7A. These experimental data confirm that the composite stamp is effectively vacuum coupled to the tool apparatus top plate. In other word, the composite stamp closely follows the motion of the tool apparatus top plate and its speed remains, within 20%, equal to the vertical speed of the top plate.

Example 2

Composite Stamps

Figure 8:
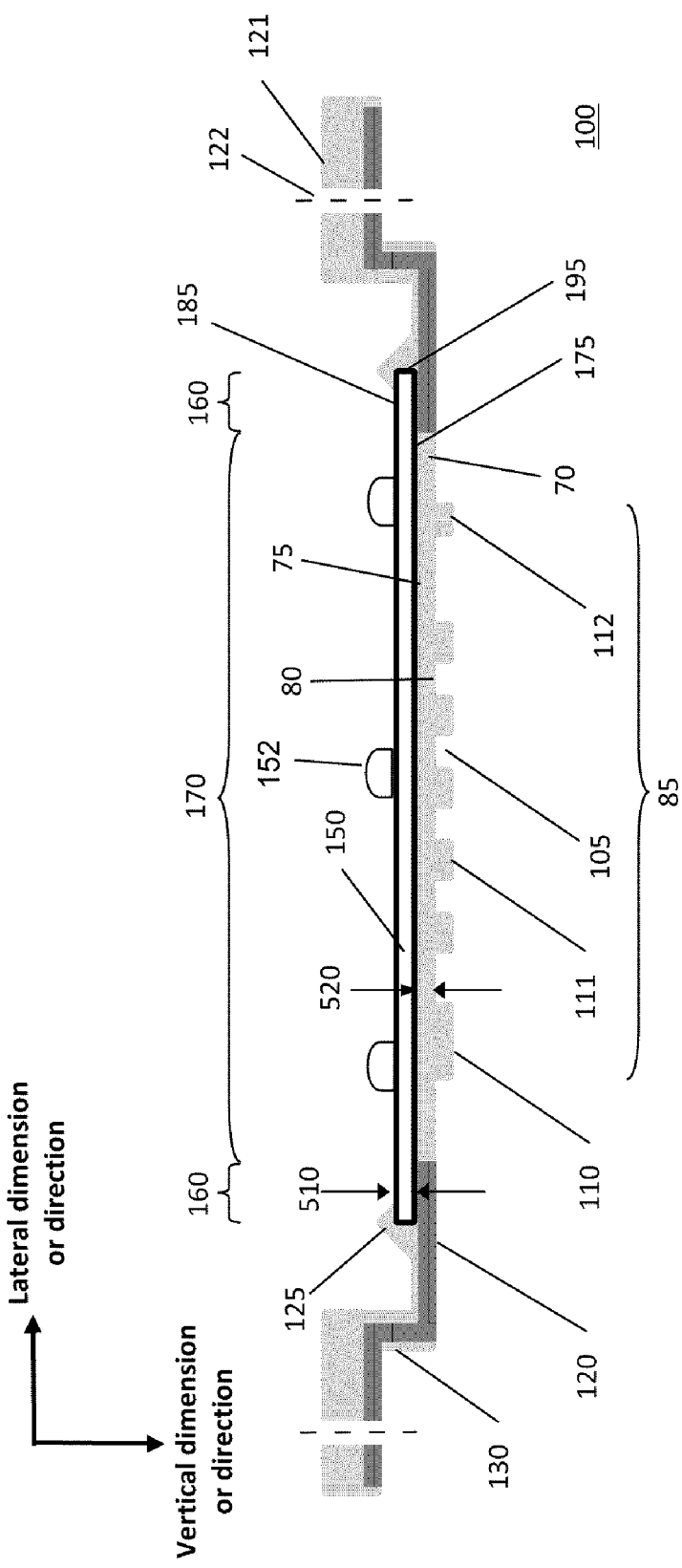
FIG. 8 is a schematic cross-sectional view of a reinforced composite stamp capable of use with any of the devices provided herein.

FIG. 8 provides a schematic cross-sectional view of an exemplary reinforced composite stamp 100, such as a stamp for use with any of the tool apparatuses provided herein. As shown in FIG. 8, the composite stamp comprises a deformable layer 70, a reinforcement layer 120, and a stiff support layer 150. An array of relief features 105 are defined on the external surface 80 of the deformable layer 70 to facilitate selective transfer of printed structures, such as semiconductor elements. Array of relief features 105 may comprise a relief pattern providing selective printing or patterning functionality. External surface 80 is the surface of deformable layer 70 configured such that it is that is capable of contacting donor or target substrates for dry-transfer printing processes, for example providing a contact surface, printing surface or receiving surface of stamp 100 for dry transfer contact printing. The deformable layer 70 also has an internal surface 75 that faces stiff support layer 150. As shown in FIG. 8, internal surface 75 is connected to the stiff support layer 150 and configured such that it does not directly contact a donor or target substrate during printing processing. In an embodiment shown in FIG. 8, deformable layer 70 is an elastomer layer and stiff support layer 150 is a thin glass backing of composite stamp 100. Stiff support layer 150 has bottom surface 175, top surface 185, and outer edges 195. Optionally, reinforcement layer 120 is positioned on top of stiff support layer 150 (e.g., facing top surface 185). Optionally, reinforcement layer 120 connected to both the top surface 185 and bottom surface 175 of stiff support layer 150. Optionally, reinforcement layer is disposed at least partially between the deformable or elastomer layer 70 and outer edge 195 of stiff backing layer 150, such as by continuing past outer edge 195 toward a stamp mounting element, such as mounting flange 121.

In the exemplified embodiment shown in the figures, reinforcement layer 120 is connected to the bottom surface 175 of stiff support layer 150 and has an opening 197 (that is vertically coincident to the plurality of relief features 105). The area of overlap between the reinforcement layer and the stiff support layer corresponds to the surface area of outer edge region 160.

The composite stamp 100 is reinforced with the reinforcement layer 120 positioned such that it is partially disposed between deformable layer 70 and stiff support layer 150. Reinforcement layer 120 is configured to support and provide reinforcement to stiff support layer 150, thereby conferring enhanced overall mechanical stability and stamp lifetime. In an embodiment, reinforcement layer 120 is a ring of woven fiberglass that is only partially disposed between the deformable layer 70 and the stiff support layer 150. As shown in FIG. 8, reinforcement layer 120 is bonded to the outer edge region 160 of stiff support layer 150, and deformable layer 70 is bound to a central region 170 of stiff support layer 150. In this example, central region 170 corresponds to the area of opening 197 in the reinforcement layer 120. In an embodiment, reinforcement layer 120 is embedded in deformable layer 70. As also shown in FIG. 8, composite stamp 100 is operably connected to an annular mounting flange 121 such that reinforcement layer 120 and/or deformable layer 70 bridges the gap between the stiff support layer 150 and the annular mounting flange 121. In an embodiment, the annular mounting flange 121 is populated with a circular array of mounting or registration features such as cylindrical perforations 122. The stamp may have antiflexural features 152 to provide additional rigidity or stiffness to stamp 100 and, therefore, facilitate planar positioning of contact surface 80 for transfer and printing.

The direction of "lateral" and "vertical" is illustrated in FIG. 8 by the arrows labeled with the relevant dimension or direction description. In an embodiment where the composite stamp and stiff backing is generally circular, the lateral dimension or direction corresponds to the radial dimension or direction. The stiff backing thickness is labeled 510 and is the distance between the ends of the two associated facing arrows. The thickness of the deformable layer is labeled 520 and is the distance between the ends of the two associated facing arrows. In this aspect, the deformable layer thickness corresponds to the separation distance between the uppermost relief feature on a mold used to form the relief features and the stiff backing. Optionally, deformable layer thickness is described in terms of thickness 520 plus the height of a relief feature on the deformable layer.

In a specific embodiment, relief features 105 of deformable layer 70 are defined via a molding process using a master wafer mold that is patterned with a desired three-dimensional relief pattern. For example, the master mold pattern is optionally obtained by a photo-defined pattern in a 5 to 100 μm photo-resist layer on the surface of a mechanical grade silicon wafer. Depending on their function, relief features 105 are provided with physical dimensions and positions selected to serve a number of functions useful for printing-based processing, including, but not limited to, stabilization patterns 110 for stabilizing the printable area or printing surface area 85, transfer posts 111 to facilitate lift-off and release of printed elements, anti-sagging posts 112 to minimize stamp sagging, and alignment or registration features (not shown, such as lock-and-key features) for enhancing stamp alignment during printing.

In an aspect, the reinforcement layer 120 is positioned to contact the stiff support layer 150 at an outer edge region 160 (e.g., the reinforcement layer extends into the stiff support layer outer edge region by a distance corresponding to 160). The portion of deformable layer 70 that is positioned inside the reinforcement layer 120 (e.g., within opening 197) is referred to as the inner region 170. The relative positions of the outer edge region 160 and inner region 170 is selected for a specific processing application. In an embodiment, for example, outer edge region 160 and inner region 170 are selected such that a substantial portion of the printing region 85 is vertically coincident to opening 197 so as to provide optical transparency and vertical flexibility of printing region 85 while reinforcement layer 120 maintains in-plane rigidity and stiffness and mechanical robustness of composite stamp considering the fragility of the stiff support layer 150 (e.g., less than about 300 µm thick). In an aspect, the outer edge 160 is entirely outside the printing surface area 85, such as a printing surface area that is defined by the outer footprint of array of relief features 105. In an aspect, the outer edge region is defined as a range of outermost surface area of the stiff support layer 150, such as the outermost surface area that comprises less than 20%, less than 10% or less than 5% the surface area of the stiff support layer surface that faces the reinforcement layer (e.g., the top or bottom surface of the stiff support layer).

Figure 7:
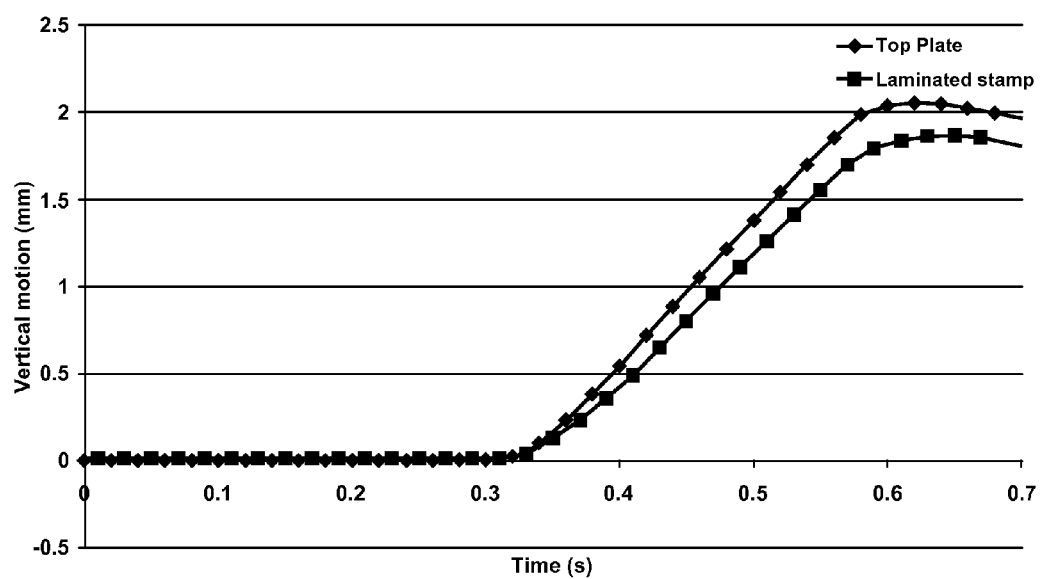
FIG. 7 presents time based waveform plots of the tool apparatus top plate and composite stamp vertical motion (A) and velocity (B).
Figure 7:
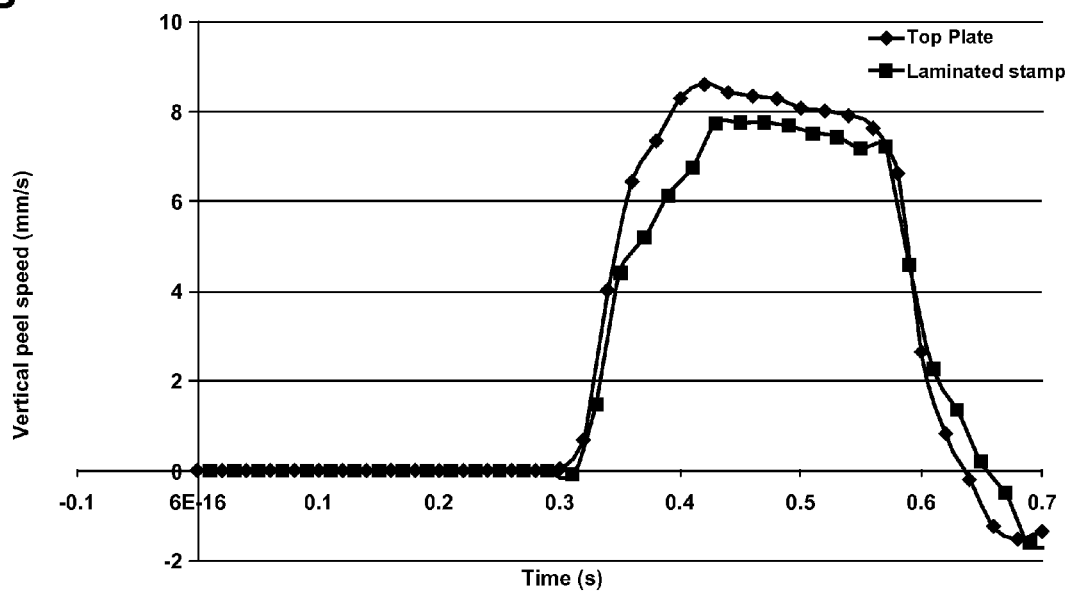

An important optional feature of a reinforced composite stamp is the ability to contact donor or target substrates having a larger surface than the reinforced composite stamp. A number of composite stamps and related printing systems known in the art are designed to interact with surfaces that are equal or less than the surface area of the composite stamp. This is a significant disadvantage for step-and-repeat processing where the stamp is used to repeatedly print to a large area of a target substrate. One design strategy for ensuring adequate clearance between the composite stamp (and particularly the print tool head to which the stamp is mounted) is illustrated in FIG. 7. In this example design, the vertical section or flange connector 130 enables the stamp patterned surface 105 to be located in a recessed plane. This stamp configuration provides a number of benefits, including: (i) facilitating mounting of the stamp by providing geometrical clearance, (ii) and enhancing out-of-plane vertical motion of the stamp's printing surface useful for establishing conformal contact with a substrate surface. As shown in FIG. 8, a protruding reinforcement ring 125 is also provided to reduce mechanical stress at the interface between the deformable layer 70 and edge of internal surface 75 and the edge of the stiff support layer 150

Further referring to FIG. 8, stiff support layer 150 has a composition and physical dimensions provided to prevent in-plane mechanical deformations of the stamps in the lateral direction. This configuration ensures that mechanical distortions induced by thermal contraction during stamp fabrication or application of in-plane stress forces during printing are minimized. In some embodiments, the stiff support layer 150 is a glass layer having a thickness selected to be less than 500 µm thick, and optionally a thickness of 100 to 300 µm. Use of such a thin stiff support layer 150 comprising a glass layer as provided in the reinforced configuration shown in FIG. 8 is useful to achieve the capability to conform to the surface of uneven substrates such as flexible plastic substrates and substrates prepatterned with devices and components, while minimizing in-plane deformation during printing that can undermine transfer accuracy and pattern fidelity.

Provided herein are various tool apparatus capable of holding stamps for use with dry transfer printing, such as printing of semiconductor elements. Detailed description of stamps for use with any of the disclosed tool apparatuses is provided in U.S. patent application Ser. No. 12/177,963. With respect to composite stamps for use with a tool apparatus provided herein, a brief description is provided herein. In some aspects, reinforced composite stamps integrate a thin glass backing layer (e.g., thickness <500 microns), a reinforcement layer having an opening that vertically coincides with at least a portion of the printable surface region of the stamp (e.g., the relief features of the deformable layer). Such an opening configuration of the reinforcement layer provides a composite stamp having mechanical properties useful accessing performance benefits over traditional stamps for soft lithographic patterning. Reinforced composite stamps described herein, for example, provide a fabrication platform for high-fidelity and high-yield dry transfer printing and assembly of semiconductor structures. The composite stamps and processing methods described herein are suitable for a range of fabrication applications for distributed electronic systems, and are particularly attractive for applications involving sparse patterning of large-area substrates with semiconductor-based electronic devices and/or device components.

In an aspect, the geometry of the reinforced composite stamp facilitates a convenient, reliable and mechanically robust attachment with related devices and processing systems, such as a print tool head or other stamp actuator or component thereof that provides clearance when a donor or a target substrate is brought into contact with the composite stamp. Composite stamps described herein are capable of achieving high-accuracy and reliable printing by constraining unwanted in-plane motion along the receiving and/or printing surface of the stamp while preserving vertical flexibility. Minimal in plane motion is beneficial for achieving high-accuracy and high yield transfer printing. Vertical flexibility is important for achieving conformal contact, especially with uneven surfaces, which impacts the ability to pick-up structures (e.g., "inking" the stamp) and also to subsequently deposit the structures onto or into a target substrate. In general, traditional stamps suffer from not sufficiently addressing the need for the combination of in plane rigidity and vertical flexibility.

In plane motion, such as resulting in out-of-plane deformation, is minimized by use of a stiff support layer and reinforcement layer such that unwanted in-plane motion is avoided without unduly impacting overall vertical flexibility of the stamp. In some embodiments, shaping the reinforcement layer into a particular geometry or layout allows the distribution of a mechanical parameter of the stamp to be effectively controlled and/or preselected for a desired patterning application. Reinforcement layers of certain embodiments, for example, have a flexural rigidity lower than that of the stiff support layer and a central orifice shape corresponding to the shape and/or size of the printable region of the stamp. Optionally, provided are composite stamps with one or more antiflexural features on the top surface, or embedded within the top surface, of the stiff layer. Feature is used broadly and refers to any structured placement of features that provides increased rigidity or stiffness and particularly reduced overall unwanted stamp bowing, and includes, but is not limited to, lines, grids or an array of structured elements that impart additional flexural rigidity. Antiflexural features are particularly useful in embodiments where there is an ultra-thin stiff backing layer having a large surface area. Ultra-thin and large surface area stiff layers are prone to in-plane flexure or buckling, particularly under the conditions described herein where there can be rapid pressure changes on the stamp top surface. This combination of components provides useful in plane rigidity (e.g., reduced overall bowing) without unduly impacting vertical flexibility in the stamp printing region and can enhance the overall mechanical stability and lifetime of the stamp.

In an aspect, the stiff backing layer permits the stamp some flexibility to achieve conformal contact with a surface that is curved, while also minimizing unwanted deformation that could result in degradation of transfer efficiency. In particular, the thin stiff backing layer (and optional antiflexural feature(s)) ensures, during alignment, the stamp remains parallel and in plane. For example, if the stamp has unwanted deformation (e.g., bowing), fine alignment is difficult to achieve and transfer printing efficiency suffers accordingly.

In an aspect, a composite stamp integrates a thin stiff support layer with a reinforcement layer having an opening that vertically coincides with at least a portion of the relief features used to facilitate printing. This combination of device components enables composite stamps having vertical flexibility useful for enhancing conformal contact between the stamp and a substrate undergoing processing while maintaining a degree of in-plane rigidity useful for achieving high resolution and high yield transfer. In an embodiment, for example, provided is a composite stamp extending laterally along lateral dimensions and vertically along a vertical dimension comprising: (i) a deformable layer having an internal surface and an external surface positioned opposite the internal surface, the external surface of the deformable layer having a plurality of relief features; (ii) a stiff support layer connected to the internal surface of the deformable layer, wherein the stiff support layer has a bottom surface and a top surface positioned opposite the bottom surface, wherein the bottom surface is positioned proximate to the internal surface of the deformable layer; and (iii) a reinforcement layer operably connected to the stiff support layer, the reinforcement layer having an opening that vertically coincides with at least a portion of the relief features of the external surface of the deformable layer. In an embodiment of this aspect, the deformable layer, stiff layer and reinforcement layer are configured to provide the stamp having an anisotropic distribution Young's modulus or flexural rigidity providing flexibility along the vertical dimension and in-plane rigidity along the lateral dimensions of the composite stamp. As used herein, "connected" broadly refers to either direct bonding between layers or indirect bonding between layers via one or more intermediate layers or structures, such as an adhesive layer. Connected structures and layers may be bonded, for example, by chemical bonding involving covalent bonds, dipole-dipole interactions, hydrogen bonding, Van der Waals forces, London forces or any combination of these. As used herein, "proximate" refers to a position of two stamp components, or features thereof, that are in physical contact, adjacent to and/or optionally within 1000 microns of each other.

Incorporation of a reinforcement layer having an opening that vertically coincides with the relief features enables mechanically robust composite stamps having a thin (e.g., less than or equal to 500 microns) stiff support layer. This aspect of is useful for providing stamps capable of high yields of transferred elements and patterning of non-planar surfaces, such as contoured substrates or uneven substrates pre-patterned with device components. Stiff support layers preferably have a relatively high Young's modulus, for example a Young's modulus selected over the range of about 10 GPa to about 100 GPa. Use of a thin stiff support layer having a high Young's modulus and/or a high flexural rigidity is beneficial because it provides composite stamps having a lateral rigidity large enough to minimize distortions of the relief pattern which may occur upon formation of conformal contact between the stamp and the surface of a device substrate or donor substrate. The reduction in relief pattern distortion provided by incorporation of a thin stiff support layer having a high Young's modulus and/or high flexural rigidity enables effective transfer, assembly and/or integration of semiconductor structures having very small dimensions such as microscale and/or or nanoscale structures. Certain embodiments, for example, incorporate a stiff support layer having a flexural rigidity selected over the range $10^{-3}$ Nm to 1 Nm, so as to provide a stamp exhibiting appropriate flexibility.

The composition and vertical dimensions (e.g., thickness) of the thin stiff support layer are properties that determine, at least in part, the overall conformability and flexural rigidity of the stamp. In an embodiment, for example, the stiff support layer comprises a thin glass layer, for example, a thin layer comprising one or more glasses selected from the group of low cost soda-lime type glass, low coefficient of thermal expansion borosilicate type glass or preferably alkali-free aluminoborosilicate E-type glass commonly used in flat panel displays. In some embodiments, a thin stiff support layer has an average thickness in the region vertically corresponding to the printing region or receiving region of the stamp (e.g., the region having relief features) that is less than or equal to 500 µm for some embodiments, and optionally less than or equal to 300 µm. In an embodiment, the stiff support layer has a thickness, optionally in the region vertically corresponding to the printing or receiving region of the stamp, selected over the range of 100 µm to 300 µm, and optionally having an average thickness selected over the range of 300 µm to 500 µm. Use of a glass stiff support layer having a thickness less than or equal to 300 µm provides enhanced overall stamp conformability useful for high yield patterning of large substrate areas with microscale and/or nanoscale semiconductor elements. Optionally, the stiff support layer has a substantially uniform thickness, for example in the region of the receiving or printing surface of the stamp, with deviations from absolute uniformity of less than 20%, or less than 10% for some embodiments. Optionally, the stiff support layer is optically transparent, for example in the visible region of the electromagnetic spectrum, to allow optical alignment, registration and/or positioning by visualization through the composite stamp. In an aspect, the stiff support layer is a glass backplane, or other stiff and optically transparent material.

Reinforcement layers are positioned so as to mechanically support and strengthen the stiff support layer of the present composite stamps, thereby allowing use of thin stiff support layers. Optionally, reinforcement layers are positioned so as to provide mechanically robust coupling between the stiff support layer and components of an actuating system, such as a tool head and/or mounting flange of a stamping system. In an embodiment, for example, the reinforcement layer is connected to the top surface of the stiff support layer, the bottom surface of the stiff support layer or both the top and bottom surfaces of the stiff support layer. In an embodiment, for example, the reinforcement layer is at least partially disposed between at least a portion of the deformable layer and the stiff support layer. In an embodiment, for example, the reinforcement layer is at least partially embedded in the deformable layer. In an embodiment, the reinforcement layer is provided adjacent to the stiff support layer. As used herein "adjacent to" refers to a position directly adjacent to and in physical contact with the stiff support layer or a position wherein the reinforcement layer is connected to the stiff support layer.

In an embodiment, the reinforcement layer is described in terms of an area of overlap with the stiff support layer. "Area of overlap" refers to the portion of the stiff support layer for which there is vertical coincidence with the reinforcement layer. In an aspect, the area of overlap is confined to an outer surface area region of the stiff support layer, such as extending from the outer edge of the stiff support layer to within a specified distance. The extending distance is optionally selected from a range that is between 2 mm to 20 mm. Alternatively, the area of overlap is described in percentage terms relative to the surface area of the stiff support layer surface that faces the reinforcement layer (e.g., either the top surface or the bottom surface of the stiff support layer). In this aspect, the area of overlap is optionally greater or equal to than 5%, greater than or equal to 10%, greater than or equal to 25%. Alternatively, the area of overlap is described in terms of an absolute value, such as selected from a range that is between about 4 cm² and 180 cm². In an embodiment, the area of overlap is confined to an outer region of the stiff support layer, with an opening in the reinforcement layer that is centrally positioned and vertically coincident with at least a portion of centrally located plurality of relief features on the external surface of the deformable layer. In an embodiment the reinforcement layer extends substantially to the outer edge of the stiff support layer. In an embodiment, the area of overlap extends to the outer edge of the stiff support layer. In an embodiment, the area of overlap extends past the outer edge of the stiff support layer, such as continuing beyond the stiff support layer. In that embodiment, the reinforcement layer may facilitate mounting the stamp to a printing tool, for example.

The composition of the reinforcement layer determines, at least in part, the mechanical properties of composite stamps. In an embodiment, the reinforcement layer comprises a fiber component, such as a fiber component that is glass fibers, polymer fibers, liquid crystal polymer fibers, carbon fibers or a mixture of fibers, or alternatively a particle component, such as nanoparticles or microparticles. Optionally, the reinforcement layer comprises a high tensile strength glass fiber component. In an embodiment, for example, glass fibers of the reinforcement layer are selected from the groups consisting of S-glass, S2-glass, and E-glass. In an embodiment, the reinforcement layer comprises fibers provided in a woven configuration, for example, a layer of woven fiberglass or woven carbon fibers. In an embodiment, the reinforcement layer comprises one or more materials having a low coefficient of thermal expansion, for example, a coefficient of thermal expansion less than or equal to 5 PPM/K. In an embodiment, the reinforcement layer comprises materials having a coefficient of thermal expansion selected to match (e.g., to with 20%, 10% or 5%) the coefficient of thermal expansion of the reinforcement layer.

The physical dimensions, including shape, of the reinforcement layer are also selected to impart useful mechanical properties and performance capabilities of the composite stamps. In an embodiment, the reinforcement layer has an average thickness along the vertical dimension of the stamp selected over the range of 100 microns and 1000 microns. In an embodiment, the flexural rigidity of the reinforcement layer is selected so as to provide effective coupling of the stiff support layer and a component of an actuation system, such as a printing system. Reinforcement layers having a flexural rigidity that is at least ten times less than the flexural rigidity of the stiff support layer, for example, are useful for providing mechanically robust coupling to a tool head or mounting flange component of printing system such that mechanical failure is minimized, thereby achieving useful stamp lifetimes. In an embodiment, the reinforcement layer has a flexural rigidity selected over the range of $10^{-3}$ Nm to 1 Nm.

Reinforcement layers may have a range of shapes selected to enhance in plane rigidity, increase stamp lifetime and protect the relatively thin support layer, while preserving the vertical flexibility, elasticity and conformability of the stamp's printable or active region. In some embodiments, the reinforcement layer has one or more openings (or voids) that vertically coincides with at least a portion of the receiving or printing surface of the stamp (e.g., the external face of the deformable layer having a plurality of relief features). Use of a ring shaped reinforcement layer, for example, provides functional benefits on such as increased placement accuracy, high transfer yield, and/or stamp lifetime. Although any shape can be used with the composite stamps provided herein, examples of reinforcement central orifice and/or reinforcement edge shapes include, but are not limited to, rings, squares, ellipse, circles, rectangles and arbitrary shapes having smooth, sharp or a combination of smooth and sharp edges, depending on the specific device and stamp configuration. In an embodiment, the opening of the reinforcement layer has a surface area greater than or equal to 10 cm². Alternatively, the opening area of the reinforcement layer is described in percentage terms relative to the surface area of the stiff support layer. In this aspect, the opening area is optionally greater or equal to than 75%, greater than or equal to 90%, greater than or equal to 95%.

A reinforcement layer may have a spatially varying distribution of at least one mechanical property that beneficially impacts stamp performance. In some embodiments, for example, modulation of the Young's modulus in the vertical direction, flexural rigidity, or stiffness provided by the spatially varying distribution enables vertical flexibility while maintaining a useful degree of in-plane rigidity. In the context of a specific embodiment, a "spatially varying distribution" refers to a distribution of values of at least one mechanical parameter that varies selectively along one or more lateral dimensions of a stamp or component thereof. In some embodiments, the reinforcement layer has a distribution of Young's modulus, flexural rigidity or stiffness in the direction corresponding to the vertical dimension of the stamp (e.g., thickness) that varies selectively along a lateral dimension selected from the group consisting of the length, width, diameter or radius of the reinforcement layer. In an embodiment, the spatially varying distribution of Young's modulus or flexural rigidity is symmetrical about the center of the composite stamp along lateral dimensions, optionally with a minimum value at the center of the stamp and maximum values at the outer edges of the stamp. In an embodiment, the stiff support layer terminates laterally at one or more outer edges, and the Young's modulus or flexural rigidity of the reinforcement layer is larger proximate to the outer edges than regions of the reinforcement layer corresponding to the printing or receiving surface of the stamp (e.g., regions of the deformable layer having relief features). In an embodiment, for example, the reinforcement layer has a first region disposed between the relief features of the deformable layer and the stiff support layer and has a second region disposed between the outer edges of the stiff support layer and the deformable layer; wherein the Young's Modulus of the second region is larger than that of the first region.

In an embodiment, the reinforcement layer is only partially disposed between the deformable layer and the stiff support layer, and optionally has one or more openings or voids disposed between at least a portion of the relief features and the stiff support layer. In a specific embodiment of this aspect, the reinforcement layer is a ring, optionally having a thickness selected over the range of 200 microns to 500 microns, which is optionally positioned at least partially between the outer edges of the stiff support layer and the deformable layer. In an embodiment, the reinforcement layer is a woven fiberglass ring, and optionally the woven fiber glass ring is at least partially embedded in or otherwise integrated into the deformable layer. In an embodiment, any of the stamps disclosed herein have a reinforcement layer that is bonded to, or positioned at, an outer edge region of the support layer. In an aspect of this embodiment, the deformable layer is optionally bonded to or in direct contact with an inner region of the stiff support layer. This configuration is useful for constraining in-plane motion of the deformable layer by bonding to the stiff support layer. In some configurations, for example, the reinforcement layer has a central opening thereby allowing for direct bonding between the deformable layer and the stiff support layer. In some embodiments, the central opening or void is optically transparent, for example in the visible region of the electromagnetic spectrum, thereby allowing optical alignment, registration and/or positioning by visualization through the composite stamp.

Integration of the reinforcement layer can be achieved by a range of composite stamp configurations. In certain embodiments, for example, the reinforcement layer is supported directly by, and optionally bonded directly to, the stiff support layer and/or the deformable layer. Alternatively, one or more intermediate layers, such as adhesive layers or other structural elements, are used for bonding the reinforcement layer, the stiff support layer and/or the deformable layer. In an embodiment, the reinforcement layer of a composite stamp is at least partially embedded in the deformable layer. Bonding between components in these embodiments may be provided by chemical bonding, for example involving covalent bonds, dipole-dipole interactions, hydrogen bonding, Van der Waals forces, London forces or any combination of these. Use of a fiberglass reinforcement layer is beneficial because it is capable of establishing strong bonding with an elastomeric deformable layer (e.g., PDMS layer), thereby resulting in mechanical robust composite stamps exhibiting long lifetimes. In an embodiment, the reinforcement layer is shaped or selected so as to not interfere with optical alignment, registration and/or positioning by visualization through the composite stamp. For example, a reinforcement layer that is not optically transparent may be positioned so that the opening coincides with the region for which optical alignment, registration and/or positioning is visualized.

Deformable layers for some embodiments have a low Young's modulus, for example a Young's modulus selected over the range of about 0.5 MPa to about 10 MPa. Use of a low modulus deformable layer, such as an elastomer layer, is beneficial because it provides composite stamps having the capability to effectively establish conformal contact with large areas (up to several m$^2$) of smooth surfaces, flat surfaces, uneven surfaces, rough surfaces, particularly surfaces having roughness amplitudes up to about 1 micron, and uneven surfaces, preferably surfaces having waviness of less 100 microns. In addition, use of a low modulus deformable layer allows conformal contact to be established between the contact surface of the stamp and large areas of a substrate surface using relatively low pressures (about 0.1 kN m$^{-2}$ to about 10 kN m$^{-2}$) applied to the stamp. Further, incorporation of a low modulus deformable layer provides useful release characteristics of the present composite stamps with a range of substrate surfaces.

In some embodiments, the deformable layer has a thickness selected over the range of 100 micron to about 500 microns. In some embodiments, the deformable layer is a polymer layer, and is optionally an elastomer layer, such as a poly(dimethylsiloxane) (PDMS) layer. Deformable layers may have any pattern of relief features useful for a given printing, patterning and/or device fabrication application, for example having one or more stabilization features, pattern transfer features (e.g., transfer posts), registration features, and/or alignment features. Patterns of relief features useable may comprise a singular continuous relief feature or a plurality of continuous and/or discrete relief features. Selection of the physical dimensions of relief features or their arrangement in a relief pattern is made on the basis of the physical dimensions and relative arrangements of the structures to be assembled or otherwise generated on a substrate surface undergoing processing. Patterns of relief features useable in composite stamps may comprise one or more relief features having physical dimensions selected over the range of about 10 nanometers to about 100 millimeters, preferably selected over the range of about 10 micrometers to about 1 millimeters for some applications. Patterns of relief features may occupy a wide range of receiving or printing surface areas, for example receiving or printing surface areas selected over the range of about 1 cm$^2$ to about 10 m$^2$ are preferred for some applications. In an embodiment, the deformable layer has a plurality of pattern transfer features configured to allow sparse transfer and/or integration of semiconductor elements onto or into a device substrate. Optionally, the deformable layer is optically transparent, for example in the visible region of the electromagnetic spectrum, to allow optical alignment, registration and/or positioning by visualization through the composite stamp. In an aspect, the deformable layer is an optically transparent elastomeric layer.

A composite stamp is optionally further characterized by one or more physical properties and/or functional capabilities. In an aspect, a composite stamp has a net flexural rigidity selected from the range of 1×10$^{-3}$ Nm to 1 Nm. In an aspect, a composite stamp has an average vertical direction Young's modulus that is between 0.5-10 MPa and an average in plane Young's modulus that is between 10-100 GPa. In an aspect, the stamp has a receiving or printing surfaces that experiences a vertical bow (e.g., an unwanted localized vertical displacement) of less than about 100 µm, for an actuation force, such as for example an actuation force of less than or equal to 50 mPSI. In an aspect, the composite stamp provides vertical bowing that is at least about 10 times less than the overall vertical displacement of the stamp. In an aspect, reinforced composite stamp is capable of achieving a placement accuracy of printable elements that is better than ±4 µm at 3σ, or ±1.2 µm at 3σ over a patterned substrate surface area of 9 cm$^2$ Adjacent layers or components of the composite stamp may be bonded by any means known in the art of soft lithography and microfabrication. For example, bonding between the internal surface of the deformable layer and the stiff support layer or between the reinforcement layer and the stiff support layer may be provided using any composition, structure or bonding scheme providing a mechanically useful system capable of undergoing stretching and/or compression displacement encountered during dry transfer printing without mechanical failure, significant degradation or delamination. In one embodiment of this aspect, bonding between at least a portion of the surfaces is provided by covalent and/or non covalent bonding. As used herein, bonding also includes embodiments wherein bonding is provided by an adhesive or laminating layer, or a coating or thin film provided between the surfaces. Useful adhesive layers include, but are not limited to, metal layers, polymer layers, partial polymerized polymer precursor layers, and composite material layers. Also included are chemically modified surfaces to facilitate bonding with the adjacent layer. In an aspect, any of the stamps provided herein have a deformable layer that is bonded to the support layer. In an aspect, the reinforcement layer is chemically bonded to the deformable layer, the support layer, or both.

Example 3

Shear Offset

Figure 9:
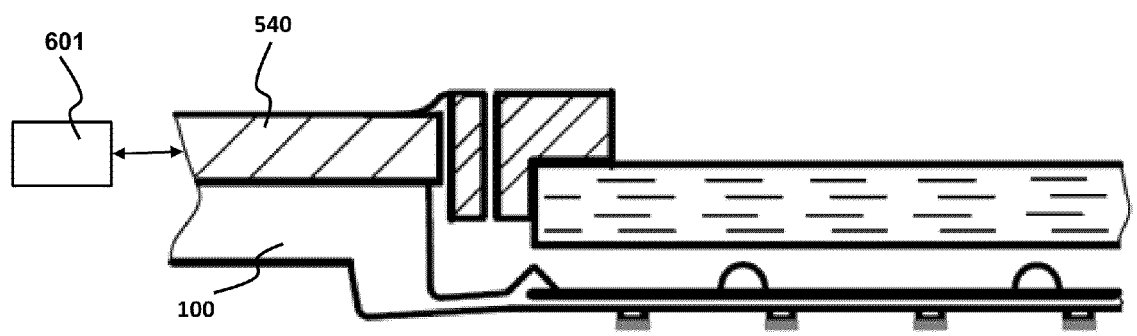
FIG. 9 is a schematic cross-section of one embodiment for shear-offset printing.

FIG. 9 illustrates an embodiment where a second actuator 601 provides the capability of shear-offset printing, such as shear-offset printing of any of the tool apparatuses and/or composite stamps provided herein. In particular, actuator 601 is operationally connected to the base plate assembly 540 for generating stamp 100 motion in a direction that is substantially parallel to the plane of the transfer surface, as indicated by the direction of the arrow. More particularly, a composite stamp, such as any of the composite stamps disclosed in Ser. No. 12/177,963, filed Aug. 29, 2008, is connected to a print tool head, such as a base plate 540. Further detail of tool head is provided in Ser. No. 12/177,963, which is hereby specifically incorporated by reference for the composite stamps, devices for holding the composite stamps and printing processes, for example. A reinforced composite stamp 100, such as disclosed in Ser. No. 12/177,963, is made of a stiff backplane layer, connected to an elastomeric layer having a relief pattern that faces a receiving substrate surface, along with a reinforcement layer in the elastomer layer and/or between the elastomer layer and stiff backing layer. Actuator 601 is any device known in the art capable of providing a controlled displacement, such as an in plane displacement. In this example, shear offset is provided by an in plane displacement of the stamp by in plane displacement of base plate 540 to which the composite stamp 100 is connected. Alternatively, shear offset is provided by in plane displacement of the receiving substrate relative to the composite stamp 100. As used herein, "in plane displacement" refers to displacement in the x-y plane, as indicated by the xyz axis in FIG. 4. A displacement is said to be "in plane" if the direction of displacement is within 10%, within 5% or within 1% of parallel to the plane formed by the x-y axis shown in FIG. 4.

Any actuator may be used in, so long as a controllable positioning and/or offset is achieved. Examples of actuators include, but are not limited to displacement actuators such as motors, stepper motor, drivers, micropositioner, or piezoelectric actuator. Other examples of actuators may not directly control displacement, but instead affect a physical parameter that in turn results in offset such as a pressure generator, a temperature controller or electric voltage generator.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure.

Every formulation or combination of components described or exemplified herein can be used to practice the invention, unless otherwise stated.

Whenever a range is given in the specification, for example, a temperature range, a size or distance range, a time range, a velocity, a pressure or rates thereof, a composition, or a concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

The invention claimed is:

1. A tool apparatus for dry transfer printing of semiconductor elements, said apparatus comprising:

a base plate having a center opening;
a top plate operationally connected to said base plate, wherein said top plate comprises an optically transparent window;
a transfer stamp for transfer printing, wherein said stamp has a top surface and a transfer surface positioned on an external surface of said stamp and oriented in a direction opposite to the direction of said top surface for transferring said semiconductor elements from a donor substrate;
a mount for operationally connecting said transfer stamp to said base plate;
an actuator operationally connected to said top plate for controllably moving said top plate; and
a micro-chamber having an internal cavity volume that separates said transfer stamp from said top plate, wherein said micro-chamber is capable of controllable pressurization and rapid depressurization by an increase in said internal cavity volume, wherein upon pressurization said internal cavity exerts a controllable pressure against said transfer stamp top surface, wherein said internal cavity has a volume that is variably controlled by said actuator moving said top plate, said internal cavity formed by said top plate and said transfer stamp top surface;
wherein:
an increase in said internal cavity volume by said top plate movement away from said stamp top surface decreases pressure in said internal cavity volume thereby moving said transfer surface in a direction away from said donor substrate.

2. The apparatus of claim 1, wherein said transfer stamp is a composite stamp.

3. The apparatus of claim 2 wherein said transfer stamp comprises:
a deformable layer having an internal surface and an external surface positioned opposite said internal surface, wherein said external surface is said transfer surface and comprises a plurality of relief features;
a stiff support layer connected to said deformable layer internal surface; and
a reinforcement layer at least partially disposed between said deformable layer and said stiff support layer, wherein said reinforcement layer is configured to provide an anisotropic distribution of Young's modulus, flexural rigidity, or stiffness providing vertical flexibility while maintaining in-plane rigidity;
wherein said stamp top surface corresponds to at least a portion of said stiff support layer.

4. The apparatus of claim 3, wherein said transfer stamp further comprises an anti-flexure feature connected to a top face of said stiff support layer.

5. The apparatus of claim 2, wherein upon pressurization of said micro-chamber, said internal cavity of said micro-chamber exerts a uniform pressure force against said transfer stamp top surface.

6. The apparatus of claim 5, further comprising a substrate surface opposed to said transfer surface, wherein upon pressurization of said micro-chamber, said transfer surface conformally contacts said substrate surface.

7. The apparatus of claim 6, wherein upon depressurization of said micro-chamber by movement of said top plate to increase said internal cavity volume, said conformal contact is removed.

8. The apparatus of claim 1, wherein said mount comprises a stamp clamping ring for securing said transfer stamp to said bottom plate.

9. The apparatus of claim 1, wherein said top plate comprises:
a window actuating fixture;
a window; and
a mounting frame having a first end that connects said window to said base plate and a second end connected to said window actuating fixture.

10. The apparatus of claim 9, wherein said micro-chamber internal cavity volume is formed by said window and said stamp top surface.

11. The apparatus of claim 9, wherein said window actuating fixture comprises an actuator receiving means that operationally connects said actuator.

12. The apparatus of claim 11, wherein said window actuating fixture comprises three actuator receiving means and wherein each actuator receiving means is operationally connected to an individual actuator.

13. The apparatus of claim 1, wherein said actuator is capable of inducing a pressure drop across said stamp and a corresponding separation force by a difference in a force against said stamp top surface and a force against said stamp transfer surface by increasing said internal cavity volume.

14. The apparatus of claim 13, wherein said separation force is generated in less than 20 ms.

15. The apparatus of claim 1, wherein said actuator is capable of moving said top plate at a velocity that is greater than or equal to 5 mm/s.

16. The apparatus of claim 1, wherein said actuator and micro-chamber cavity pressure variation are capable of separating said stamp from said donor substrate at a velocity that is greater than or equal to 5 mm/s.

17. The apparatus of claim 1, further comprising:
a passage traversing from an external surface of said top plate to an internal surface of said top plate;
a pressure-regulated vacuum source operationally connected to said passage capable of regulating pressure in said internal cavity; and
a passage inlet valve for forming an air-tight seal within said micro-chamber.

18. The apparatus of claim 1, further comprising a second actuator operationally connected to said base plate assembly for generating stamp motion in a direction substantially parallel to a plane formed by a transfer surface of said transfer stamp.

19. The apparatus of claim 1, further comprising a plurality of mechanical spacers connected to an internal surface of said top plate, a top surface of said stamp, or both.

20. A method of transferring a semiconductor element from a donor surface to a stamp transfer surface, said method comprising the steps of:
providing a tool apparatus for dry transfer printing, said tool apparatus comprising:
a top plate;
a base plate;
a mount capable of operationally connecting a transfer stamp to said base plate; and
an actuator operationally connected to said top plate capable of controllably moving said top plate;
attaching a transfer stamp to said base plate with said mount, wherein said stamp has a top surface that forms one surface of a pressurizable microchamber having an internal cavity that separates said transfer stamp from said top plate;
providing a donor substrate surface comprising a semiconductor element;
aligning said stamp transfer surface with said donor substrate surface;

pressurizing said internal cavity thereby establishing conformal contact between said stamp transfer surface and said donor substrate surface, said semiconductor element, or both;

decreasing said internal cavity pressure, wherein said decrease in internal cavity pressure is achieved by forming an air-tight seal around said micro-chamber cavity and increasing said cavity volume by activating said actuator to move said top plate in a direction that is away from said donor substrate, thereby transferring said semiconductor element from said donor surface to said stamp transfer surface.

21. The method of claim 20, wherein said stamp is a composite stamp comprising:
a deformable layer having an internal surface and an external surface positioned opposite said internal surface, wherein said external surface comprises a plurality of protrusions;
a stiff support layer connected to said deformable layer internal surface; and
a reinforcement layer at least partially disposed between said deformable layer and said stiff support layer, wherein said reinforcement layer is configured to provide an anisotropic distribution of Young's modulus, flexural rigidity, or stiffness providing vertical flexibility while maintaining in-plane rigidity;
wherein said stamp top surface corresponds to at least a portion of said stiff support layer.

22. The method of claim 20, wherein said top plate further comprises a micro-chamber inlet port for controllably pressurizing said internal cavity, said method further comprising:
establishing conformal contact between said transfer stamp receiving surface with said donor substrate surface;
closing said micro-chamber inlet port; and
activating said actuator to move said top plate in a direction that is away from said donor substrate, thereby increasing said internal cavity volume and decreasing said internal cavity pressure to separate said stamp transfer surface from said donor substrate surface.

23. The method of claim 22, wherein said top plate is moved away from said substrate at a separation speed, wherein said separation speed is greater than or equal to 5 mm/s.

24. The method of claim 22, wherein said actuator and micro-chamber cavity pressure variation are capable of separating said stamp from said substrate at a velocity greater than or equal to 5 mm/s.

25. The method of claim 22, wherein said internal cavity is depressurized at a rate that is selected from a range that is greater than or equal to about 50 psi/s (340 kPa/s) and less than or equal to about 150 psi/s (1030 kPa/s).

26. The method of claim 25, wherein said rate of depressurization is about 100 psi/s (690 kPa/s).

27. The method of claim 20, wherein said internal cavity is pressurized to a pressurized value that is selected from a range that is greater than or equal to 0.4 psig and less than or equal to 2 psig during said pressurizing step, and said internal cavity pressure is decreased to a separation value that is less than or equal to −0.1 psig, thereby releasing said stamp transfer surface from said donor surface.

28. The method of claim 20, further comprising:
providing a receiving surface;
aligning said stamp transfer surface having said semiconductor element with said receiving surface;
establishing conformal contact between at least a portion of said transfer surface and said receiving surface; and
transferring said semiconductor element from said transfer surface to said receiving surface.

29. The method of claim 28, wherein said transferring step comprises:
offsetting said transfer stamp a horizontal distance relative to said receiving surface, thereby generating an in-plane shear force in said stamp; and
separating said stamp from said receiving surface by moving said stamp in a vertical direction relative to said substrate, thereby printing said semiconductor element to said receiving surface.

30. The method of claim 20, wherein said alignment is achieved optically, mechanically, or both.

31. The method of claim 20, further comprising:
providing a negative pressure relative to ambient pressure to said internal cavity after said semiconductor element is transferred to said transfer surface, thereby reducing the time required to reach steady state pressure equilibrium in said internal cavity.

32. The method of claim 20, wherein a plurality of semiconductor elements are simultaneously transferred to said transfer surface.

33. A transfer printing tool comprising:
a top plate;
a stamp having a transfer surface, a top surface, and an elastomer layer supported by a stiff support layer, wherein said transfer surface corresponds to an external surface of said stamp and oriented in a direction opposite to the direction of said top surface for transfer printing from a donor substrate or to a receiving substrate;
an antiflexural feature connected to said stiff support layer;
a mount for securing said stamp to said top plate; and
a microchamber having an internal cavity volume formed from said top plate and said stamp top surface, wherein said microchamber separates said transfer stamp from said top plate, said internal cavity volume having a variable and controllable volume by movement of said top plate, wherein movement of said top plate in a direction away from said stamp top surface increases said internal cavity volume and decreases pressure in said internal cavity volume, thereby moving said transfer surface in a direction away from said donor or receiving substrate.

* * * * *